United States Patent [19]

Asai et al.

[11] Patent Number: 5,060,366
[45] Date of Patent: Oct. 29, 1991

[54] ELECTRONIC COMPONENT MOUNTING APPARATUS

[75] Inventors: Koichi Asai, Nagoya; Mamoru Tsuda, Okazaki; Yasuo Muto, Chiryu, all of Japan

[73] Assignee: Fuji Machine Mfg. Co., Ltd., Aichi, Japan

[21] Appl. No.: 570,617

[22] Filed: Aug. 21, 1990

[30] Foreign Application Priority Data

Sep. 5, 1989 [JP] Japan .................. 1-229603

[51] Int. Cl.$^5$ ............................. B23P 19/00
[52] U.S. Cl. ......................... 29/739; 29/740; 29/741; 29/759; 29/836; 29/709; 29/743
[58] Field of Search .............. 29/740, 741, 739, 759, 29/834, 836, 709, 743

[56] References Cited

U.S. PATENT DOCUMENTS

| 4,631,816 | 12/1986 | Fujita et al. | 29/740 |
| 4,747,198 | 5/1988 | Asai et al. | 29/407 |
| 4,809,430 | 3/1989 | Maruyama et al. | 29/834 |
| 4,951,388 | 8/1990 | Eguchi et al. | 29/740 |

FOREIGN PATENT DOCUMENTS

| 0155512 | 9/1985 | European Pat. Off. |
| 59-95700 | 6/1984 | Japan . |
| 59-113699 | 6/1984 | Japan . |
| 61-136298 | 6/1986 | Japan . |
| 205500 | 8/1989 | Japan | 29/743 |

Primary Examiner—P. W. Echols
Attorney, Agent, or Firm—Oliff & Berridge

[57] ABSTRACT

An apparatus for mounting different sorts of electronic components on a substrate, including a table rotatable about an axis; a plurality of groups of mounting heads supported by the table, each one of the head groups consisting of a plurality of identical mounting heads that differ from the identical mounting heads of each of the other head group or groups, the mounting heads of the each one head group taking an electronic component of a corresponding one of the different sorts from an electronic component supply device and mount the electronic component on a substrate. The mounting heads of the each of the head groups being supported by the table such that the mounting heads of each head group are equiangularly distant from one another on a circle whose center is located on the axis of the table; a drive device for intermittently rotating the table about the axis, the drive device rotating the table by one of a plurality of predetermined rotation amounts for each of the intermittent rotations thereof, the rotation amounts including a rotation amount equal to the equiangular distance predetermined with respect to the mounting heads of each one head group; and a changing device for changing the one of the rotation amounts for one head group to another of the rotation amounts for another head group.

16 Claims, 15 Drawing Sheets

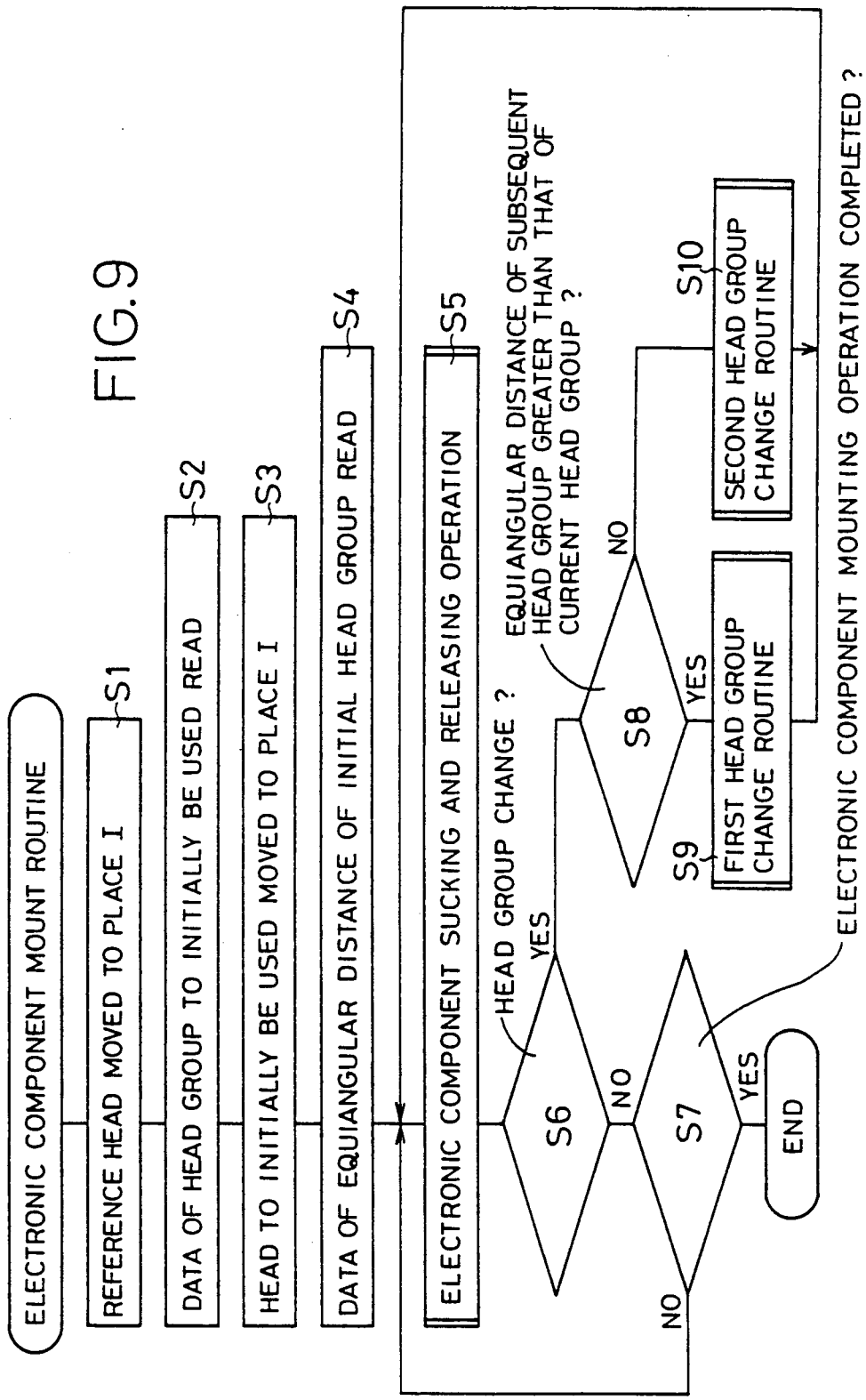

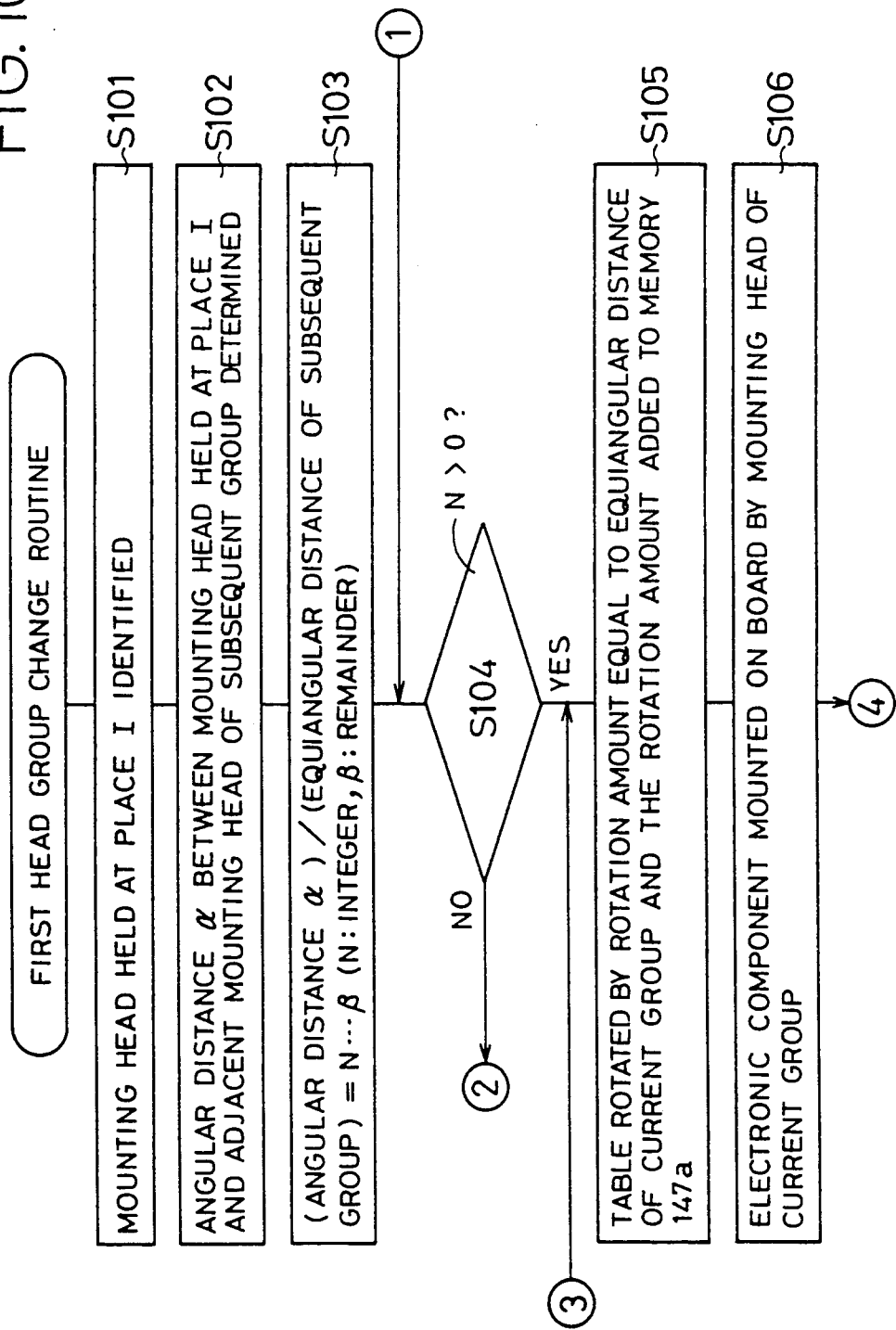

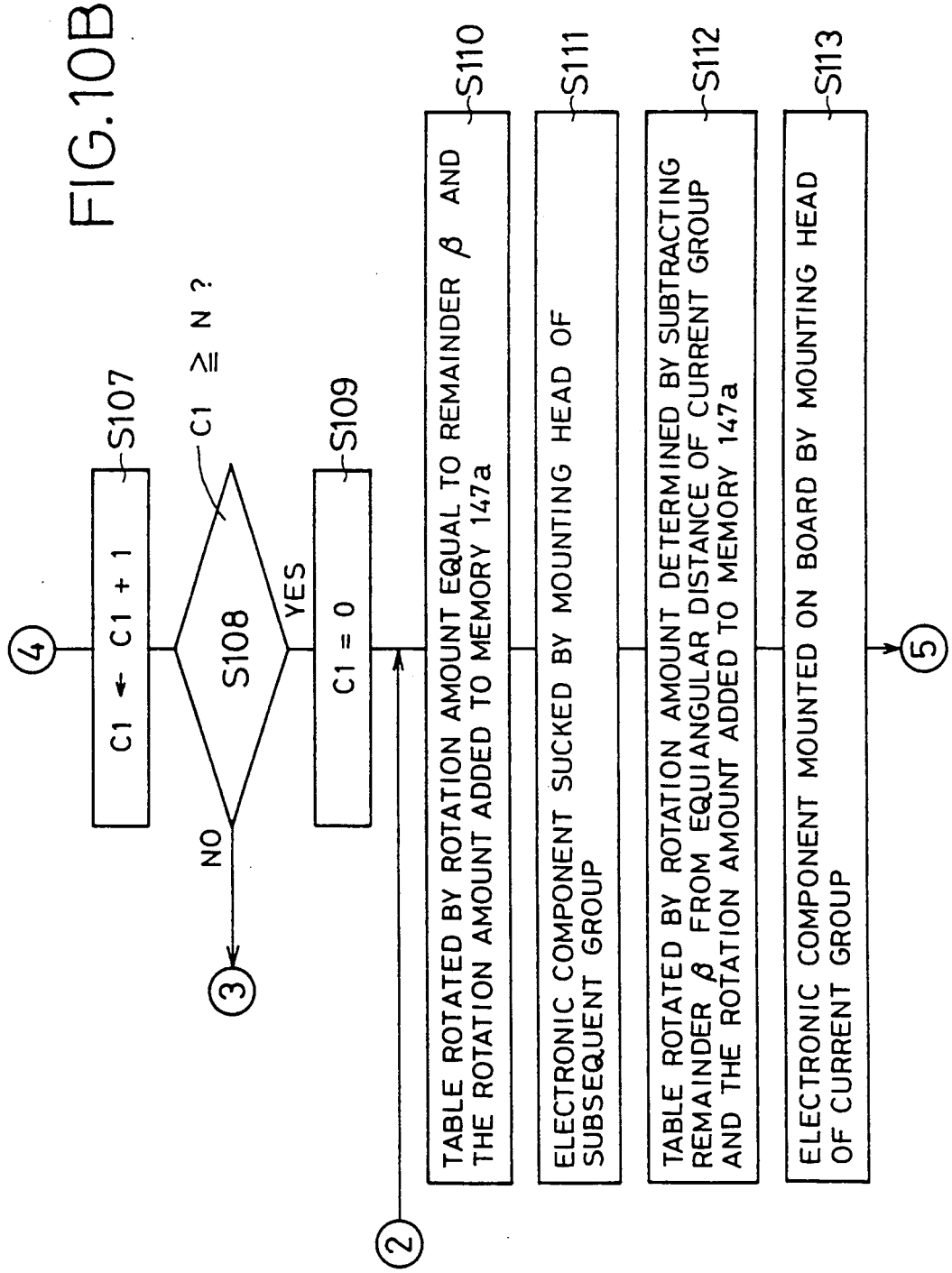

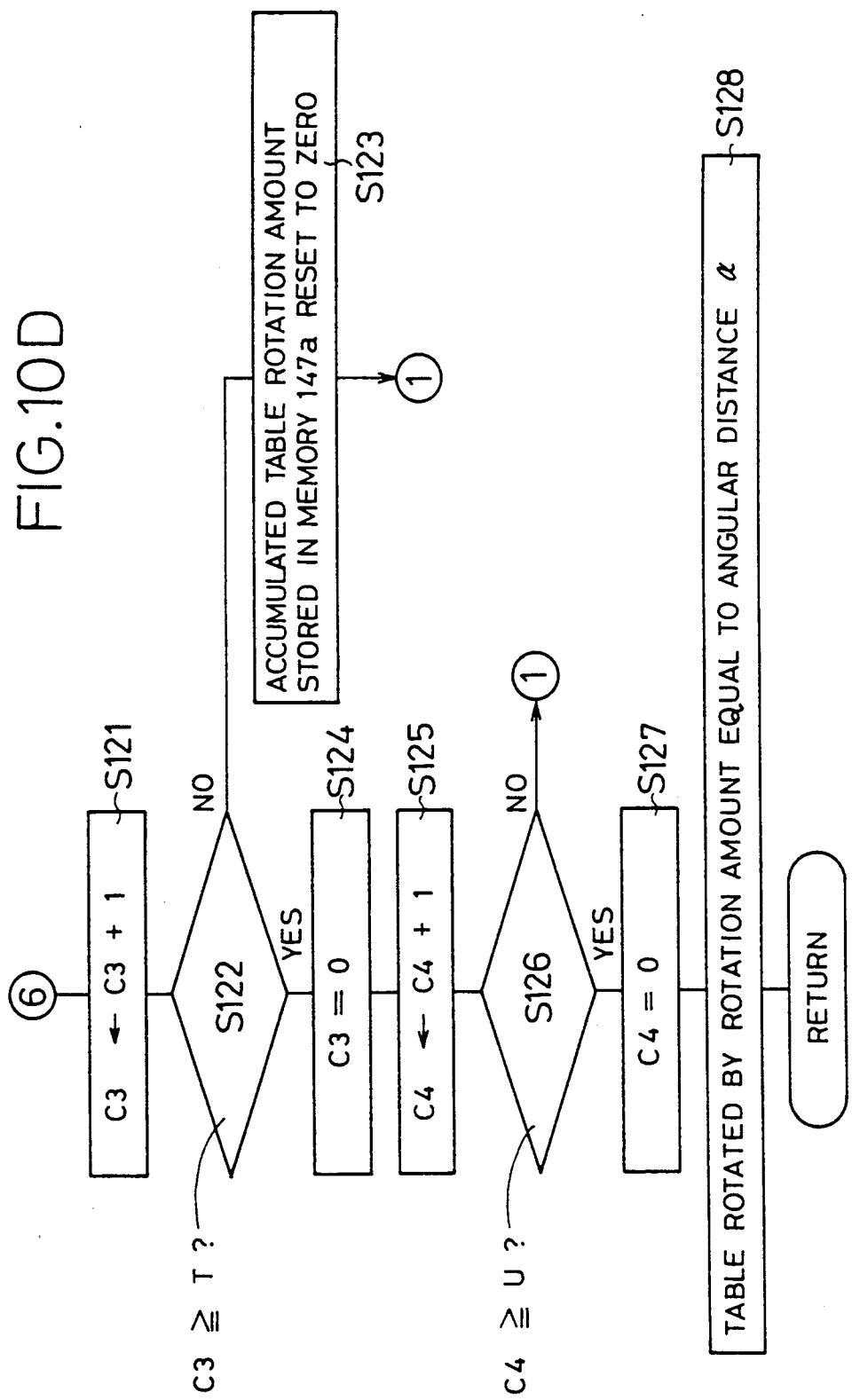

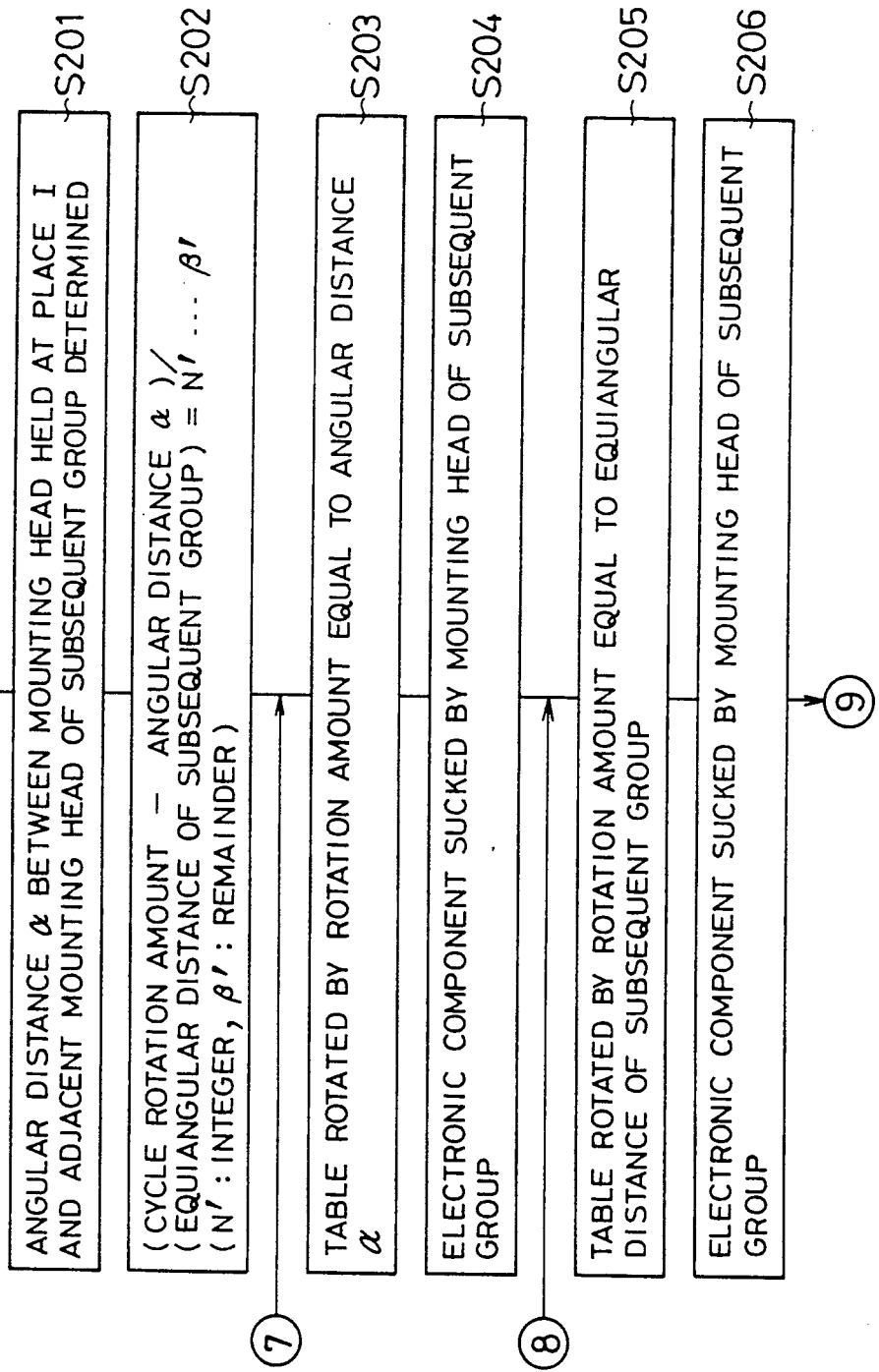

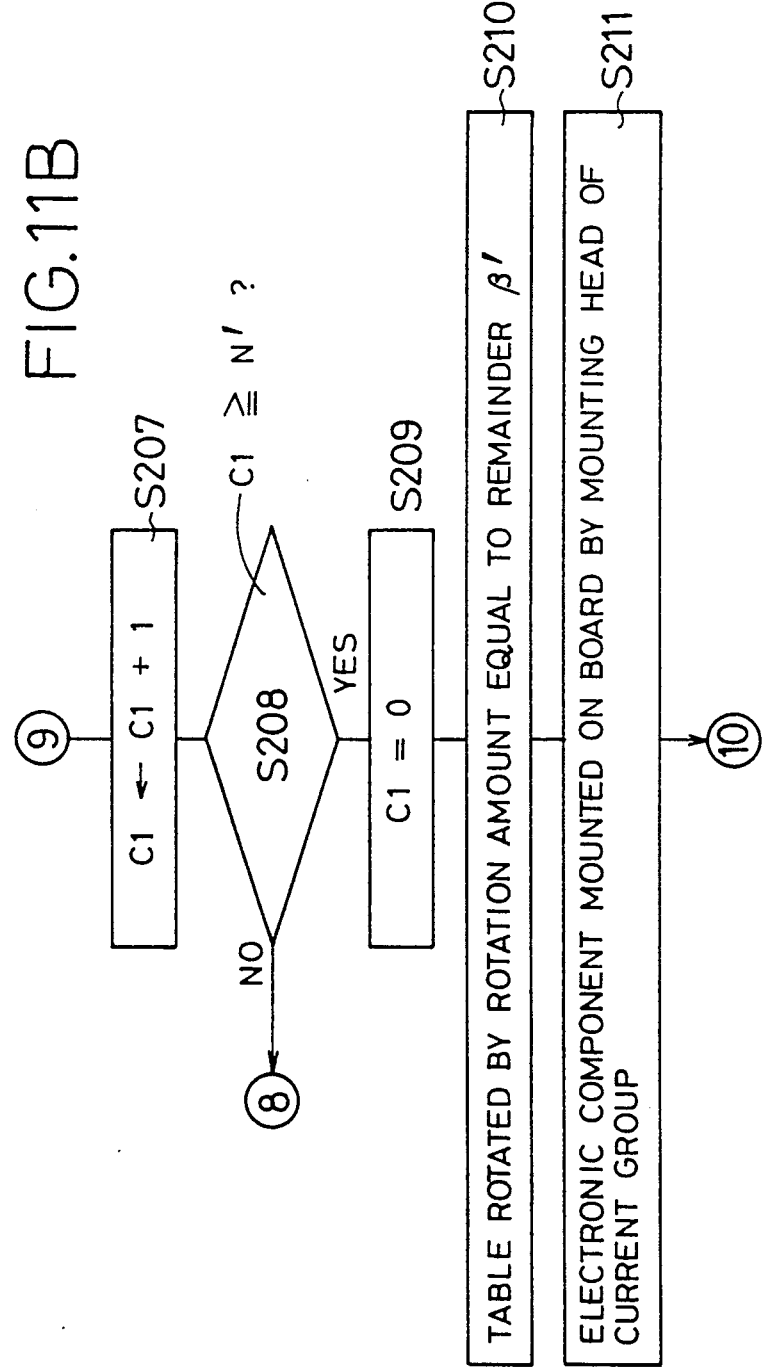

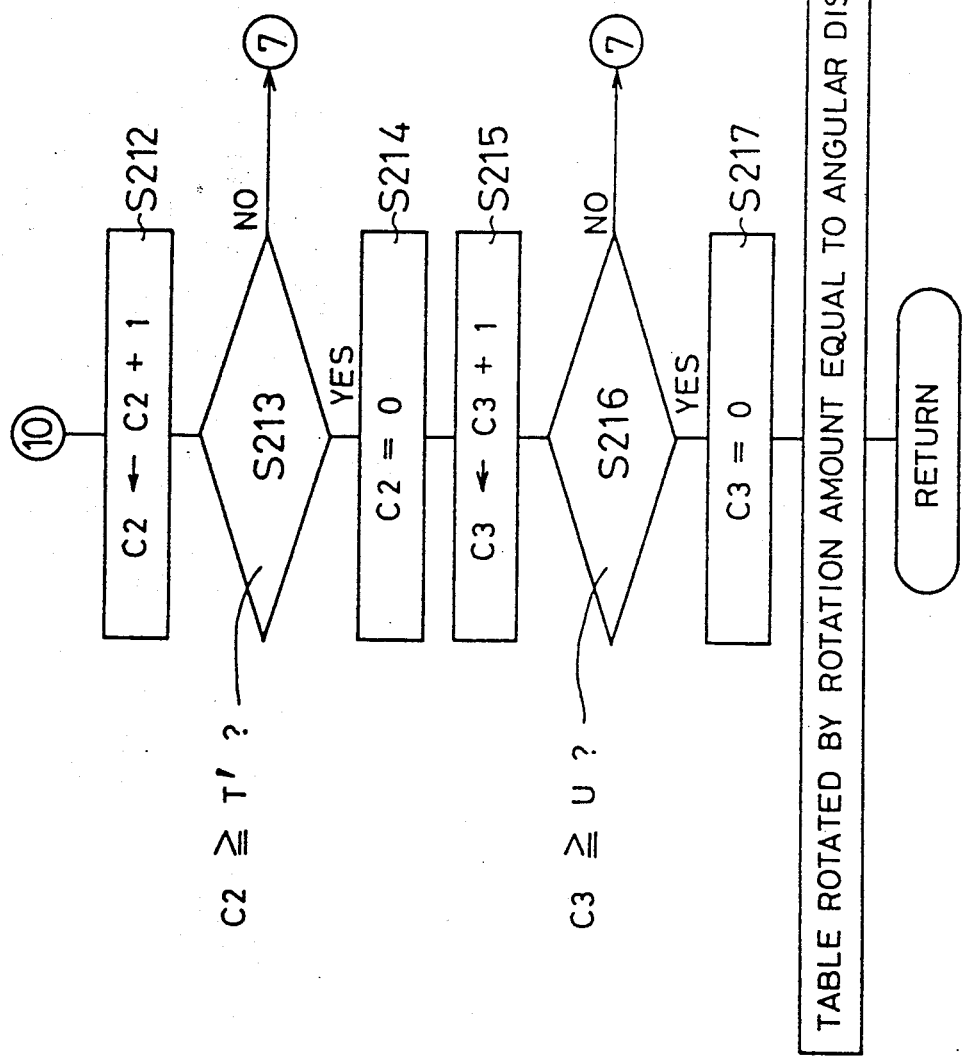

ELECTRONIC COMPONENT MOUNTING APPARATUS

BACKGROUND OF THE INVENTION

1. Field of the Invention

The present invention relates in general to an electronic component mounting apparatus and in particular to such an apparatus which has different sorts of mounting heads for mounting different sorts of electronic components on a substrate such as a printed wiring board.

2. Related Art Statement

There has conventionally been known an electronic component mounting apparatus for mounting, on a printed wiring board, different sorts of electronic components that differ from each other with respect to size, shape, weight, etc. Generally, the apparatus has different sorts of mounting heads which have different sizes or constructions corresponding to different sorts of electronic components. Japanese Utility Model Application laid-open under Publication No. 59-95700 discloses an apparatus of the above indicated type. The disclosed apparatus has a table and different sorts of mounting heads supported by the table. The different sorts of mounting heads selectively are used for mounting corresponding sorts of electronic components. More specifically described, the table is rotatable about an axis, and the mounting heads of the different sorts are supported by the table such that all of them are equiangularly distant from each other on a circle whose center is located on the rotation axis of the table, and that they consist of a plurality of pairs of mounting heads each of which pairs consist of two mounting heads of the same sort which are diametrically opposite to each other with respect to the rotation axis of the table. The table is rotated intermittently about the rotation axis thereof by a drive device in such a manner that the table is rotated, for each of the intermittent rotations thereof, by an intermittent rotation amount equal to the above indicated, equiangular distance. Consequently, the two, same mounting heads of each of the pairs are stopped, in order, at an electronic component receive or take place and an electronic component release or mount place, respectively, which places are diametrically opposite to each other with respect to the rotation axis of the table, whereby one of the two mounting heads takes an electronic component at the take place and the other mounts an electronic component on a printed wiring board at the mount place.

However, the above identified mounting apparatus is not capable of intermittently rotating the table by an intermittent rotation amount different from the rotation amount equal to the above indicated equiangular distance. Consequently, all the mounting heads of the different sorts are stopped at the operation places, i.e. electronic component take and mount places, regardless of which sort of mounting heads are used currently for the electronic component taking and mounting operation. Thus, the prior art apparatus needs a comparatively long time for moving the mounting heads, of the sort which currently are used, to the operation places. In other words, the prior art apparatus has the problem that the mounting efficiency is low.

SUMMARY OF THE INVENTION

It is therefore an object of the present invention to provide an apparatus which mounts different sorts of electronic components on a substrate with high mounting efficiency.

The above object has been achieved by the present invention, which provides an apparatus for mounting different sorts of electronic components on a substrate, comprising (A) a table rotatable about an axis, (B) a plurality of groups of mounting heads supported by the table, each one of the head groups consisting of a plurality of same mounting heads different from the same mounting heads of each of the other head group or groups, the mounting heads of the each one head group taking an electronic component of a corresponding one of the different sorts, from an electronic component supply device, and mounting the electronic component on a substrate, the mounting heads of the each one head group being supported by the table such that the mounting heads are equiangularly distant from each other on a circle whose center is located on the axis of the table, (C) drive means for intermittently rotating the table about the axis, the drive means rotating the table by one of a plurality of predetermined rotation amounts, for each of the intermittent rotations thereof, the rotation amounts including a rotation amount equal to the equiangular distance predetermined with respect to the each one head group, and (D) changing means for changing the one of the rotation amounts to another of the rotation amounts.

In the electronic component mounting apparatus constructed as described above, the intermittent rotation amount by which the table is rotated intermittently by the drive means, is changed from one of the predetermined rotation amounts to another by the changing means. Because of having the function of changing the intermittent rotation amount, the present apparatus is capable of mounting different sorts of electronic components on a printed wiring board with high mounting efficiency.

In a preferred embodiment of the present invention, the equiangular distance predetermined with respect to the each one head group is different from the equiangular distance predetermined with respect to the each of the other head group or groups, the rotation amounts including different rotation amounts respectively equal to the different equiangular distances predetermined with respect to the head groups. In this embodiment, the normal mounting operation of the apparatus may be effected in such a manner that, after the table is rotated intermittently by a rotation amount equal to the equiangular distance predetermined with respect to a certain head group, so that the mounting heads of the head group take and mount the electronic components of the corresponding sort, the table is rotated till the mounting heads of a different head group are moved to an electronic component take place and an electronic component mount place and, thereafter, the table is rotated intermittently by a different rotation amount equal to the equiangular distance predetermined with respect to the different head group so that the mounting heads of the different head group take and mount the electronic components of the corresponding sort. In this manner, only the mounting heads of a head group currently necessary for taking and mounting the electronic components of a corresponding sort, are stopped at the operation places, i.e. electronic component take and mount places, and none of the mounting heads of the other group or groups is stopped at the operation places. Thus, this embodiment provides an advantage that the mounting heads of the currently necessary head group are moved to the operation places in a reduced time. In other words, the efficiency of the normal mounting operation is improved. In this embodiment, the apparatus may be operated in such a manner that, after all the electronic components held by the mounting heads of a head group which currently is used are mounted on the substrate, the mounting heads of a head group which subsequently is used take electronic components from the supply device.

In another embodiment of the present invention, each of the mounting heads of the each one head group is related to one of the mounting heads of the each of the other head group or groups which one mounting head is adjacent to the each mounting head on the rear side of the each mounting head as viewed in a direction of rotation of the table, the rotation amounts including a rotation amount equal to a predetermined angular distance between the adjacent one mounting head of the each of the other head group or groups, and one of the mounting heads of the each one head group which one mounting head is adjacent to the adjacent one mounting head on the front side of the adjacent one mounting head as viewed in the rotation direction of the table. As previously described, the apparatus of the present invention may be operated in such a manner that, after all the electronic components held by the mounting heads of a head group which currently is used are mounted on a substrate, the mounting heads of a head group which subsequently is used take electronic components from the supply device. However, if electronic component take and mount places are diametrically opposite to each other with respect to the rotation axis of the table, a more than 360 degrees rotation of the table is needed for completing the head group changing operation or transitional mounting operation which starts with the concurrent electronic component taking and mounting by a pair of diametrically opposite mounting heads of the current head group at the take and mount places, and ends with the concurrent electronic component taking and mounting by a pair of diametrically opposite mounting heads of the subsequent head group at the same places. In this manner, first, the electronic component mounting operation is carried out by the mounting heads of the current head group, and then the electronic component taking operation is carried out by the mounting heads of the subsequent head group. That is, the mounting and taking operations are not carried out simultaneously or concurrently. Thus, this manner suffers from a problem that the efficiency of the transitional mounting operation is insufficient. On the other hand, in this embodiment, the head group changing operation is effected in such a manner that the electronic component mounting operation and the electronic component taking operation are carried out concurrently by the mounting heads of the current head group and the mounting heads of the subsequent head group, respectively. This embodiment is advantageous because only a more than 180 degrees rotation of the table is needed for completing the head group changing operation. That is, the efficiency of the transitional mounting operation is improved. In this embodiment, it is required that, while the table is rotated in the head group changing operation, the mounting heads of both the current and subsequent head groups be stopped at the operation places. The requirement is met by changing the intermittent rotation amount from a rotation amount equal to the equiangular distance predetermined for the current head group, to a rotation amount specified in this embodiment as indicated above. In this embodiment, it is desirable that, like the preceding embodiment, the equiangular distance predetermined for the each one head group is different from the equiangular distance predetermined for the each of the other head group or groups. However, this is not essential. Alternatively, a single, common equiangular distance may be assigned to at least two, or all, of the head groups. In these two cases, it is preferred that the intermittent rotation amount be changed from one of a plurality of different rotation amounts to another, for carrying out the transitional mounting operation (i.e., head group changing operation) with higher efficiency. However, alternatively, it is possible to use a single common rotation amount as the intermittent rotation amount, for effecting the transitional mounting operation.

In yet another embodiment of the present invention, the head groups comprising a first, a second and a third head group, the number of the mounting heads of the third head group being twice the number of the mounting heads of the second head group, the number of the mounting heads of the second head group being twice the number of the mounting heads of the first head group. In a preferred form of this embodiment, the first, second and third head groups consist of two, four and eight mounting heads, respectively, the fourteen mounting heads of the first, second and third head groups being disposed at fourteen locations out of sixteen locations which are equiangularly distant from each other on the previously indicated circle. In this form, it is preferred that the mounting heads of the first, second and third head groups take a large-size, a medium-size and a small-size electronic component from the electronic component supply device, respectively, and mount the three sorts of electronic components on the substrate, respectively. Because the mounting heads of a head group are moved, in order, to the operation places as the table is rotated intermittently by a rotation amount equal to the equiangular distance predetermined for the head group, it can be said that the smaller the equiangular distance of a head group is, the smaller the intermittent rotation amount is, and accordingly, the shorter the time needed for moving the mounting heads of the head group to the operation places is. In other words, the smaller the equiangular distance of a head group is, the higher the mounting efficiency is. However, it is physically impossible to assign the smallest equiangular distance to all the head groups. In the event, for example, that three sorts of electronic components, large-size, medium-size and small-size, are mounted on a printed wiring board under the requirements that the number of the small-size electronic components be the greatest of the three sorts and that the number of the large-size electronic components be the smallest, it is advantageous as taught by this embodiment to use the largest number of mounting heads for taking and mounting the small-size electronic components and dispose those mounting heads such that the mounting heads are spaced apart from each other by the smallest equiangular distance, while using the smallest number of mounting heads for taking and mounting the large-size electronic components and disposing those mounting heads such that the mounting heads are spaced apart from each other by the largest equiangular distance. In this case, the mounting efficiency with respect to the head group related to the large-size electronic components, is low as compared with the case where a single common equiangular distance is assigned to all the head groups, whereas the mounting efficiency with respect to the head group related to the small-size electronic components, is high as compared with the same case. Since it is generally required that a certain sort of electronic components be mounted on a printed wiring board such that the number of the electronic components of the sort is much greater than that of the electronic components of another sort, and since usually the number of small-size electronic components is much greater than that of large-size electronic components, the apparatus constructed as described above exhibits greatly improved mounting efficiency.

In a further embodiment of the present invention, the table includes an even number of mounting head support portions, the mounting head support portions supporting the mounting heads of the head groups such that the number of the mounting heads is smaller than the number of the mounting head support portions.

According to a feature of the present invention, the apparatus further comprises an electronic component take station in which the electronic component supply device is located, and an electronic component mount station in which the substrate is located, the take and mount stations being provided at respective locations which are diametrically opposite to each other with respect to the axis of the table, the mounting heads of the head groups being supported by the table such that the number of the mounting heads of each of the head groups is even. The apparatus may further comprise an electronic component position error detect station provided at a location between the electronic component take and mount stations at which location none of the mounting heads of the head groups is stopped, the position error detect station comprising image pickup means for taking a projected image of an electronic component held by a mounting head which is being moved from the take station to the mount station, and converting the taken image into binary coded signals, the image pickup means being disposed under a circular path along which the mounting head is moved as the table is rotated by the drive means, the position error detect station further comprising error calculating means for comparing the binary coded signals with reference binary coded signals representative of a nominal position of the electronic component, and thereby calculating position errors, $\Delta X$ and $\Delta Y$, of a reference point on the electronic component held by the mounting head, and an angular error, $\Delta \theta$, of the electronic component about the reference point, the error calculating means being connected to the image pickup means.

According to yet another feature of the present invention, the apparatus further comprises memory means for storing data relating to the equiangular distance predetermined with respect to the each one head group, and control means for controlling the drive means to intermittently rotate the table according to the data stored in the memory means.

According to a further feature of the present invention, the apparatus further comprises identifying means for identifying, each time the table is stopped, which one of the mounting heads is stopped at a reference place on a circular path along which the mounting heads are moved as the table is rotated by the drive means. The identifying means may comprise (1) measuring means for measuring a rotation amount of the table, the measuring means resetting the measured rotation amount to zero each time each one of the mounting heads of one of the head groups which one head group consists of the smallest number of mounting heads of all the head groups, are stopped at the reference place, (2) memory means for storing data relating to a predetermined angular distance between the each one of the mounting heads of the one head group and each of the mounting heads of the other head group or groups which mounting heads are disposed between the each one of the mounting heads of the one head group and another of the mounting heads of the one head group which another mounting head is adjacent to the each one of the mounting heads on the rear side of the each one of the mounting heads as viewed in a direction of rotation of the table, and (3) comparing means for comparing the rotation amount of the table measured by the measuring means, with the data stored in the memory means, each time the each of the mounting heads of the head group or groups is stopped at the reference place, and thereby identifying which one of the mounting heads is stopped at the reference place. Alternatively, it is possible to operate the apparatus in a manner taught by this embodiment only with respect to at least one of the mounting heads of the head group consisting of the smallest number of mounting heads.

According to another feature of the present invention, the apparatus further comprises (a) an electronic component take station in which the electronic component supply device is located, and an electronic component mount station in which the substrate is located, the take and mount stations being provided at respective locations which are diametrically opposite to each other with respect to the axis of the table, the mounting heads of the head groups being supported by the table such that the number of the mounting heads of each of the head groups is even, (b) generating means for generating a head group change signal for changing a head group which currently is used for the electronic component taking and mounting operation, to another head group which subsequently is used for the same purpose, and (c) transition control means for controlling the drive means, upon generation of the head group change signal, to intermittently rotate the table such that the mounting heads of both the current head group and the subsequent head group are stopped at the electronic component take and mount stations, until the mounting heads of the current head group mount on the substrate all the electronic components that have been held thereby. The transition control means may comprise (1) judging means for judging whether or not the head group change commanded by the head group change signal is such that the number of the mounting heads of the subsequent head group is smaller than the number of the mounting heads of the current head group, and (2) transition stop control means for selecting one of two predetermined programs depending upon the affirmative or negative judgement of the judging means, and controlling the drive means according to the selected one program so that the mounting heads of both the current and subsequent head groups are stopped at the electronic component take and mount stations. The transition stop control means may comprise memory means for storing data relating to a predetermined angular distance between each of the mounting heads of the each one head group and one of the mounting heads of the each of the other head group or groups which one mounting head is adjacent to the each mounting head of the each one head group on the rear side of the each mounting head as viewed in a direction of rotation of the table, the transition stop control means controlling the drive means based on the data stored in the memory means.

BRIEF DESCRIPTION OF THE DRAWINGS

The foregoing and other objects, features and advantages of the present invention will be better understood by reading the following detailed description of the presently preferred embodiment of the invention when considered in conjunction with the accompanying drawings, in which:

FIG. 9 shows the flow chart of an electronic component mount program stored in a ROM of the computer of FIG. 6;

DETAILED DESCRIPTION OF THE PREFERRED EMBODIMENTS

Figure 1:
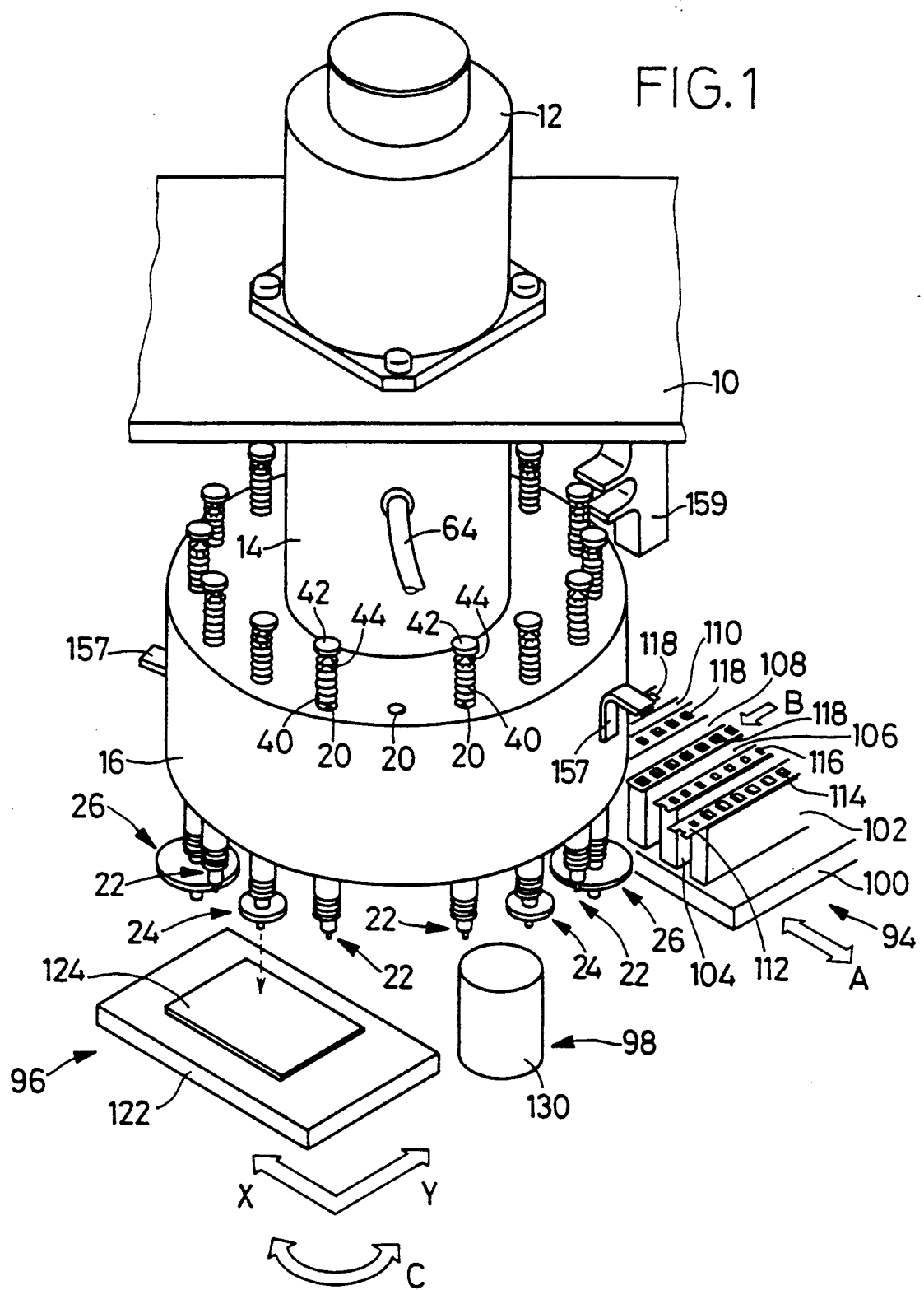
FIG. 1 is a perspective view of an electronic component mounting apparatus embodying the present invention.

Referring first to FIG. 1 there is shown an electronic component mounting apparatus embodying the present invention. In the figure, reference numeral 10 designates a base member, to the upper surface of which a direct drive (DD) motor 12 is fixed such that a drive shaft thereof extends vertically as viewed in the figure. The DD motor 12 is a servo motor capable of rotating an object by required angular amounts. In addition, the DD motor 12 generates a large torque without having to use a speed reducer, while being driven at low speed. The drive shaft of the DD motor 12 is coupled to a rotation shaft (not shown) which is rotatably received in a cylindrical member 14 fixed to the lower surface of the base member 10. A table 16 is fixed to the lower end of the rotation shaft which end extends out of the lower end of the cylindrical member 14. The DD motor 12 intermittently rotates the table 16 in such a manner that the table 16 is rotated by a predetermined rotation amount (hereinafter, referred to as the "intermittent rotation amount") for each of the intermittent rotations thereof. In the present embodiment, the DD motor 12 serves as drive means for intermittently rotating the table 16.

Sixteen holes 20 are formed through the thickness of the table 16 such that the holes 20 are arranged on a circle whose center is located on an rotation axis 17 (FIG. 2) of the table 16 and that the holes 20 are equiangularly distant from each other on the circle. The holes 20 serve as support portions for supporting three groups of electronic component mounting heads 22, 24, 26. The first group of mounting heads 22 serve for mounting small-size components. The first group 22 consist of four pairs of mounting heads 22 of the same size and construction, and each pair of mounting heads are diametrically opposite to each other with respect to the rotation axis 17 of the table 16. The eight mounting heads of the first group 22 are supported by the table 16 such that the mounting heads 22 are equiangularly distant from each other. In other words, the mounting heads 22 are supported by the alternate holes 20. The second group of mounting heads 24 serve for mounting medium-size electronic components. The second group 24 consist of two pairs of mounting heads of the same size and construction, and each pair of mounting heads are diametrically opposite to each other. The size and construction of the mounting heads of the second group 24 are different from those of the mounting heads of the first group 22. The four mounting heads of the second group 24 are supported by the table 16 such that the mounting heads 24 are equiangularly distant from each other. In addition, the third group of mounting heads 26 serve for mounting large-size electronic components. The third group 26 consist of one pair of mounting heads 26 of the same size and construction, and the pair of mounting heads 26 are diametrically opposite to each other. The size and construction of the mounting heads of the third group 26 is different from those of the mounting heads of the first or second group 22, 24. Since the two mounting heads of the third group 26 are diametrically opposite to each other, the two mounting heads 26 are spaced from each other by 180 degrees on the table 16.

In the present embodiment, three sorts of electronic components, small-size 118, medium-size 116 and large-size 114, are mounted on a printed-wiring board 124, such that the number of the small-size components 118 mounted is the largest and the number of the medium-size components 116 mounted is the second. The present apparatus is adapted such that the first group 22 consist of the largest number of mounting heads and the second group 24 consist of the second largest number of mounting heads.

Figure 2:
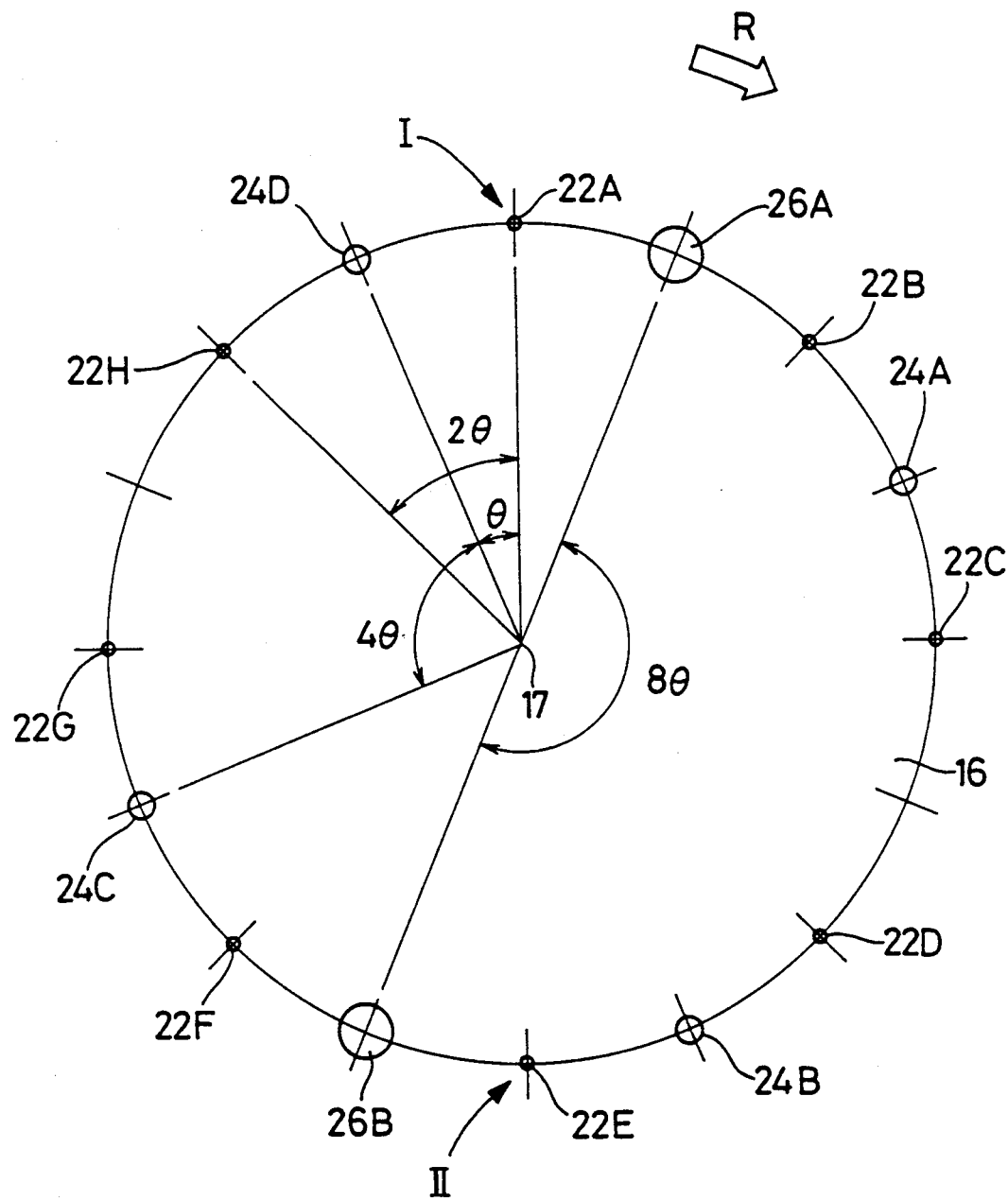
FIG. 2 is a view for illustrating the positional relationship between the mounting heads of the three groups supported by a rotatable table of the apparatus of FIG. 1.

FIG. 2 illustrates the eight mounting heads 22A-22H of the first group each indicated at a small circle, the four mounting heads 24A-24D of the second group each indicated at a medium circle, and the two mounting heads 26A, 26B of the third group each indicated at a large circle. Hereinafter, the equiangular distance, 22.5 degrees, between each pair of adjacent two holes 20, with respect to the rotation axis 17 of the table 16, is expressed as $\theta$. Therefore, the equiangular distances predetermined with respect to the first, second and third groups 22, 24, 26 are expressed as 2θ, 4θ and 8θ, respectively. The equiangular distance of the third group 26 is twice that of the second group 24, which in turn is twice that of the first group 22. Hereinafter, the mounting heads of the first, second, and third groups 22, 24, 26 are referred to as the "S", "M", and "L" heads 22, 24, 26, respectively, when appropriate. In addition, the rotation amount of the table 16 is expressed by units of θ.

Figure 3:
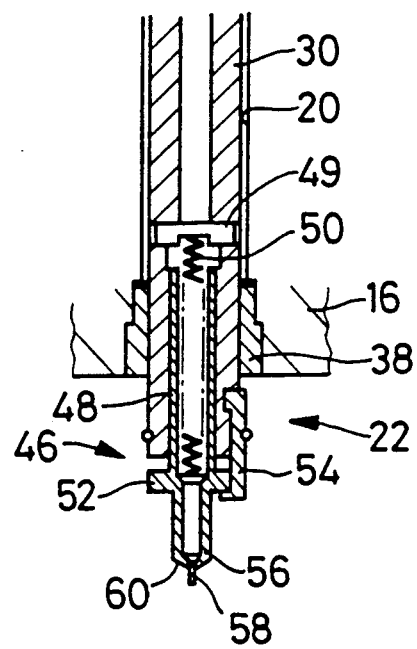
FIG. 3 is an elevational cross-sectional view partially showing a mounting head belonging to one of the three groups which group corresponds to small-size electronic components.

FIG. 3 shows a "S" head 22 supported by a hole 20 of the table 16. A main body 30 of the "S" head 22 is received in the hole 20 such that a radial clearance is left between the main body 30 and the wall surface defining the hole 20. The "S" head 22 is guided by a bush 38 and a guide cylinder 40 such that the head 22 is movable upward and downward. The bush 38 is fixed to the table 16 such that the bush 38 defines the lower opening of the hole 20. The guide cylinder 40 is fixed to the upper opening of the hole 20. The main body 30 has a large diameter portion 42 at the top thereof. A spring 44 is disposed between the upper surface of the table 16 and the large diameter portion 42 of the main body 30 so as to bias the main body 30 upward. A sucking device 46 is supported by the lower end portion of the main body 30. The sucking device 46 includes a cylindrical nozzle support 48. The nozzle support 48 has an upper open end and a lower closed end 56, and is vertically slidably received in the main body 30. The nozzle support 48 is biased downward by a spring 50 resting on a pin 49. The downward movement of the nozzle support 48 is limited by butting of an outer flange 52 extending horizontally from an exposed lower end portion of the nozzle support 48, against a stopper member 54 secured to the lower end portion of the main body 30. The lower closed end 56 of the nozzle support 48 supports a nozzle 58 having a small diameter, such that the nozzle 58 is fitted in a hole formed through the thickness of the closed lower end 56. An outer surface of the closed lower end 56 is coated with a fluorescent paint, and serves as a fluorescent surface 60. When the fluorescent surface 60 is irradiated by an ultraviolet light, the surface 60 absorbs the light and generates a visible light.

The "S" head 22 takes a small-size component by sucking it by means of vacuum. In the cylindrical member 14, is provided a vacuum passage (not shown) which is connected to a vacuum source (not shown) via a hose 64 (FIG. 1). In the cylindrical member 14, also is provided an ambient air (atmospheric pressure) passage. These passages are connected via couplings to a vacuum passage and an ambient air passage (not shown) provided in the table 16, respectively. The communication between those vacuum passages and the communication between those ambient air passages are maintained even when the table 16 is rotated. The vacuum and ambient air passages provided in the table 16 are connected via a selector valve (not shown) to a communication passage (not shown) communicating with a space in the main body 30, more specifically in the nozzle support 48. When the selector valve is placed in one position in which the communication passage is connected to the vacuum source, the nozzle 58 sucks a small-size electronic component by means of vacuum. When the selector valve is placed in the other position in which the communication passage is connected to the ambient air passage (i.e., ambient air under atmospheric pressure), the nozzle 58 releases the electronic component that has been held thereby.

Figure 4:
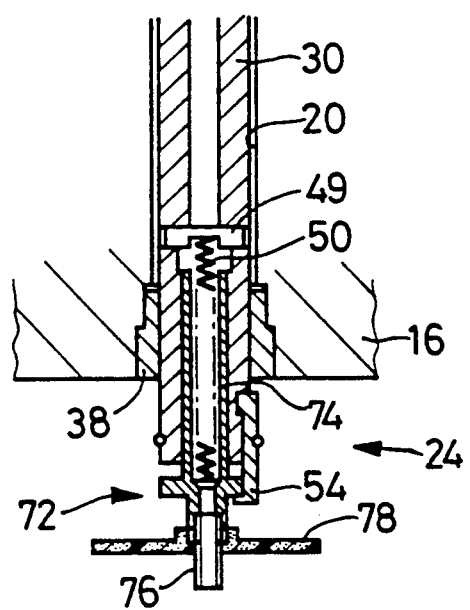
FIG. 4 is an elevational cross-sectional view partially showing a mounting head belonging to one of the three groups which group corresponds to medium-size electronic components.

FIG. 4 shows an "M" head 24 supported by a hole 20 of the table 16. The "M" head 24 has a construction similar to that of the "S" head 22 of FIG. 3, except for a sucking device 72. The same reference numerals as used in FIG. 3 are used in FIG. 4 to identify the corresponding members or parts, and repetitive description of those members or parts is omitted. The sucking device 72 includes a cylindrical nozzle support 74 which supports a medium diameter nozzle 76 in a manner similar to the nozzle support 48 of FIG. 3. A fluorescent plate 78 is secured to the nozzle support 74 and nozzle 76. The fluorescent plate 78 is formed of a material prepared by mixing a fluorescent paint with a synthetic resin such as acrylic resin or polyacetal resin (e.g., 'DELRIN' available from Du Pont Co., 'DURACON' available from Poly Plastic Co.). When the fluorescent plate 78 is irradiated by an ultraviolet light, the plate 78 absorbs the light and generates a visible light. The fluorescent plate 78 is so dimensioned as to assure an overall irradiation of a medium-size electronic component sucked by the nozzle 76.

Figure 5:
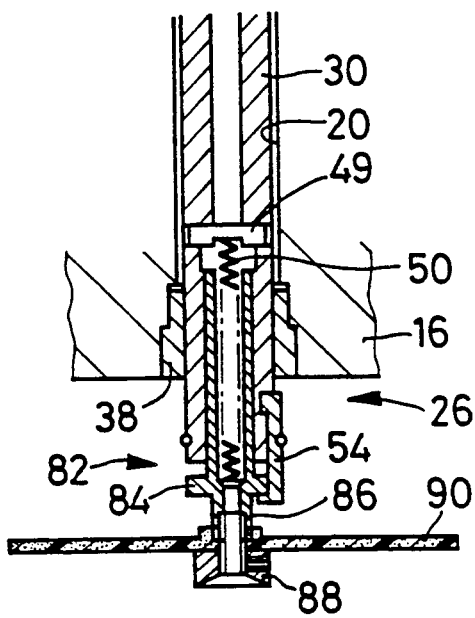
FIG. 5 is an elevational cross-sectional view partially showing a mounting head belonging to one of the three groups which group corresponds to large-size electronic components.

FIG. 5 shows an "L" head 26 supported by a hole 20 of the table 16. The "L" head 26 has a construction similar to that of the "S" head 22 of FIG. 3, except for a sucking device 82. A nozzle support 84 of the sucking device 82 supports a nozzle 86 in a manner similar to the nozzle support 48 of FIG. 3. A suction cup 88 having a diameter larger than that of the nozzle 86, is fixed to the lower end of the nozzle 86, thereby providing a large diameter sucking element. A fluorescent plate 90 is sandwiched between the nozzle support 84 and the suction cup 88. The fluorescent plate 90 has a structure similar to that of the fluorescent plate 78 of FIG. 4, but is larger in size than the plate 78 so that the plate 90 can irradiate a large-size electronic component sucked by the large diameter sucking element.

Under the table 16, there are provided an electronic component suck station 94 and an electronic component mount station 96. These stations 94, 96 are spaced apart from each other in a diametric direction of the table 16. In addition, an electronic component position error detect station 98 is provided between the above indicated two stations 94, 96. In the suck station 94, is provided an electronic component supply table 100 which is reciprocated along a path indicated at A in FIG. 1. On the supply table 100, a plurality of electronic component supply units 102-110 are disposed along the path A. The supply units 102-110 extend parallel to each other. Each of the supply units 102-110 is brought into an electronic component supply place and held thereat, as a result of an appropriate movement of the supply table 110 along the path A. Each supply unit 102-110 includes a tape feed device (not shown) which intermittently feeds a carrier tape 112 which supports at regular intervals of distance a plurality of same electronic components in the form of rectangular chips. The carrier tape 112 is fed over a length equal to the interval of distance for each of the intermittent movements thereof, along a path indicated at B in FIG. 1. Thus, the supply units 102-110 supply the mounting heads 22, 24, 26 with electronic components in an intermittent manner. An electronic component at the leading end of the carrier tape 112 which is fed by the supply unit 102-110 held at the above indicated supply place, is located directly below one of the mounting heads 22, 24, 26. This location is an electronic component suck place. Of the four supply units 102-110, the unit 102 feeds large-size electronic components 114, the unit 104 feeds medium-size electronic components 116, and the units 106-110 feed small-size electronic components 118. Hereinafter, the large-, medium- and small-size components are referred to as the "L", "M" and "S" components, respectively. Since the number of the "S" components 118 to be mounted is the largest of the three sorts, the largest number of supply units 106-110 are used for supplying the "S" components 118. The "L", "M" and "S" components 114, 116, 118 are sucked exclusively by the "L", "M" and "S" heads 26, 24, 22, respectively.

In the electronic component mount station 96, is provided an X-Y table 122 which is movable in directions indicated at X and Y. The X-Y table 122 rests on a table (not shown) which is rotatable about a vertical axis as indicated at C in FIG. 1. The location of the vertical axis, namely, rotation axis of the table, is an electronic component mount place, which place is diametrically opposite to the previously described electronic component suck place with respect to the rotation axis 17 of the table 16. The printed wiring board 124, on which the three sorts of electronic components are to be mounted, is supplied onto the X-Y table 122 and held thereon by a feed device (not shown). As a result of an appropriate movement and/or rotation of the X-Y table 122, a portion of the board 124 on which portion an electronic component is to be mounted, is brought into the above indicated mount place. In FIG. 2, the electronic component suck and mount places are indicated at Roman numerals I and II, respectively (hereinafter, referred to as Place I and Place II).

A first and a second push member (not shown) are provided between the base member 10 and the table 16 such that the first and second push members are aligned with Place I and Place II, respectively. The first and second push members are moved upward and downward by a first and a second drive devices 126, 128 (FIG. 6), respectively, independent of each other. When the first push member associated with Place I is moved downward, the push member pushes down the main body 30 of a mounting head 22, 24, 26 held at Place I, and when the push member is moved upward, the main body 30 is moved upward due to the biasing force of the spring 44. The second push member associated with Place II is operated similarly to the first push member.

In the electronic component position error detect station 98, is provided an image pickup device 130. The image pickup device 130 is disposed at a location under a circular path along which the mounting heads 22, 24, 26 are moved as the table 16 is rotated by the DD motor 12, at which location none of the mounting heads is stopped. The image pickup device 130 takes a projected image of an electronic component held by a mounting head 22, 24, 26 which is being moved at a constant speed. The image pickup device 130 includes a filter and a lamp which emits an ultraviolet light through the filter. The ultraviolet light emitted by the image pickup device 130 is absorbed by the fluorescent surface 60 or plate 78, 90 of a mounting head 22, 24, 26, respectively, which in turn emits a visible light toward the electronic component held by the mounting head. Thus, the image pickup device 130 takes a projected image of the electronic component, and converts the taken image into binary coded signals. A control device (not shown) compares the thus obtained signals with reference binary coded signals representative of a nominal position of the electronic component, and thereby calculates position errors $\Delta X$, $\Delta Y$ of the center of the rectangular electronic component held by the mounting head, and a rotation error $\Delta \theta$ of the electronic component about the center thereof. The position error detecting operation in which a projected image of an electronic component is utilized, is taught in detail in Japanese Patent Application laid open under Publication No. 1-193897. By the way, since the electronic component held by a mounting head 22, 24, 26 is moved along a circular path, the radially outer portion of the electronic component is moved at a higher peripheral speed than that of the inner portion thereof. While taking into consideration this peripheral speed difference between the outer and inner portions of the electronic component, the above-indicated control device processes the projected image taken by the image pickup device 130.

Figure 6:
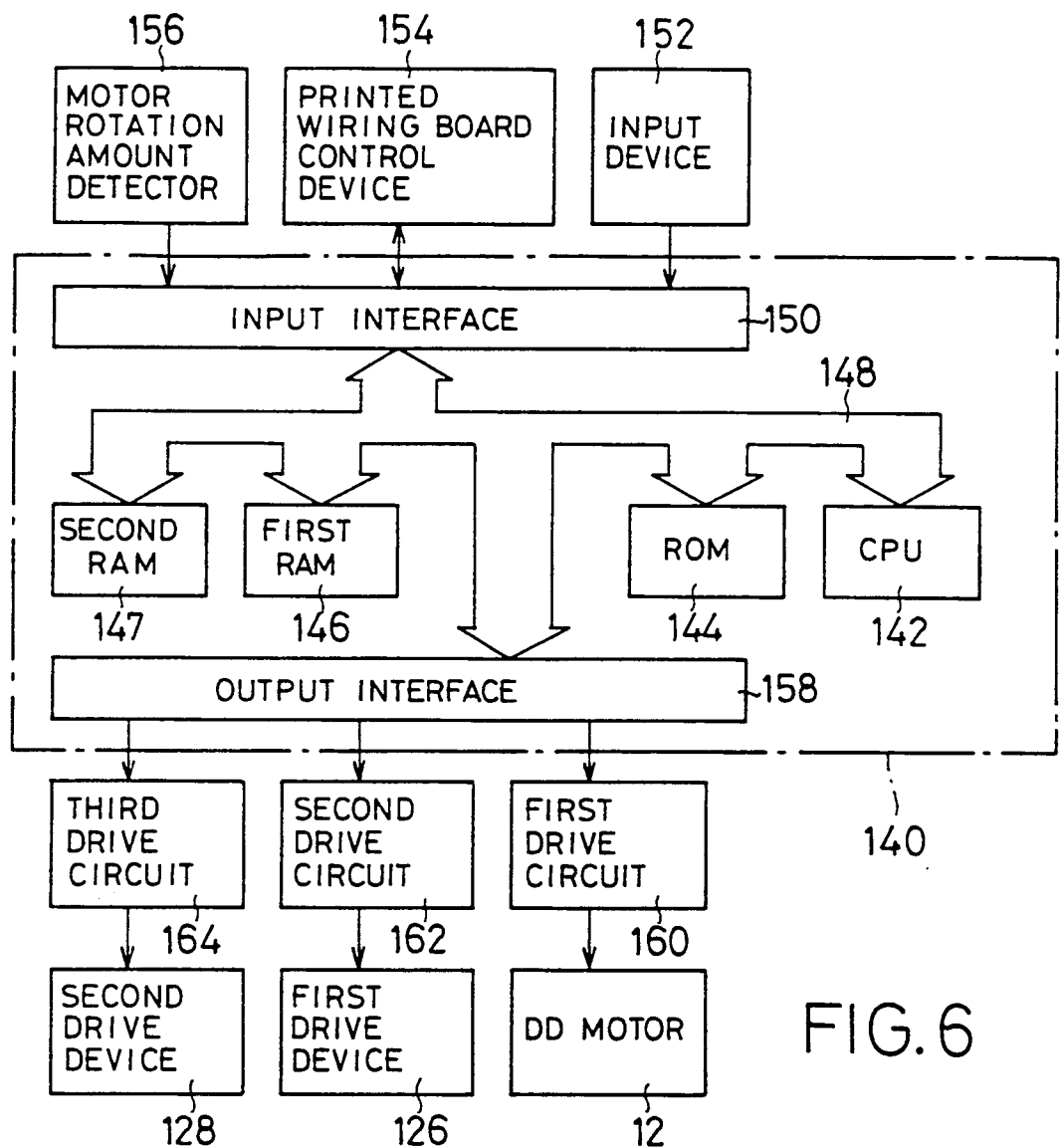
FIG. 6 is a diagrammatic view of the arrangement of a control device of the apparatus of FIG. 1 which device includes a computer as an essential part thereof.

FIG. 6 shows a control device 140 for controlling the mounting operation of the present apparatus. The control device 140 essentially is constituted by a microcomputer including a central processing unit (CPU) 142, a read only memory (ROM) 144, a first and a second random access memories (RAMs) 146, 147, and a bus 148 connecting the elements 142-147 to each other. An input interface 150 is connected to the bus 148. An input device 152, a printed wiring board control device 154, and a motor rotation amount detector 156 each are connected to the input interface 150. Through the input device 152, data required for effecting the mounting operation are supplied to the control device 140. The board control device 154 controls the feeding and positioning of the printed wiring board 124, together with the position adjustment of the board 124 effected for accurately mounting an electronic component on a specified portion of the board 124. The motor rotation amount detector 156 measures an amount of rotation of the DD motor 12, and thereby measures a rotation amount of the table 16 when the table 16 is rotated by the DD motor 12 in a direction indicated at R in FIG. 2. Each time a reference head detector switch 159 provided at Place I detects dogs 157, 157 fixed to the table 16 in alignment with the "L" heads 26A, 26B, respectively, the detector 156 resets its content (i.e., measured rotation amount) to zero. In other words, the detector 156 measures a rotation amount of the table 16 within the range of 0 to 180 degrees. To the bus 148, an output interface 158 is connected. The DD motor 12 and the push member drive devices 126, 128 are connected to the output interface 158 via a first, a second and a third drive circuit 160, 162, 164, respectively.

Figure 7:
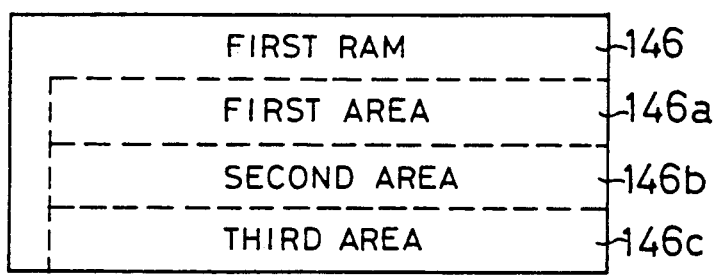
FIG. 7 is an illustrative view of a backup-type RAM of the computer of FIG. 6.

The first RAM 146 is a backup-type RAM that is capable of keeping the data stored therein because of utilizing an incorporated battery even if external power supply is cut off from the present apparatus. FIG. 7 shows a first, a second and a third area 146a, 146b, 146c of the RAM 146. The first area 146a stores the previously described equiangular distances, 28, 40, 80, predetermined with respect to the "S" heads 22 of the first group, the "M" heads 24 of the second group, and the "L" heads 26 of the third group, respectively. The second area 146b stores a predetermined angular distance between each of the fourteen heads 22A-22H, 24A-D, 26A, 26B, and the closest one of the mounting heads of each of the two groups different from the group to which the mounting head belongs. The predetermined angular distances stored in the second area 146b, that is the distance between a mounting head of a first head group and the closest rearward related mounting head of a second head group ignoring any intervening mounting head from any other head group, with respect to the rotation direction R of the Table 16, are as follows:

TABLE I

| "S" Heads | To Adjacent "M" Head | To Adjacent "L" Head |
|---|---|---|
| 22A, 22E | $\theta$ | $7\theta$ |
| 22H, 22D | $3\theta$ | $5\theta$ |
| 22G, 22C | $\theta$ | $3\theta$ |
| 22F, 22B | $3\theta$ | $\theta$ |
| "M" Heads | To Adjacent "S" Head | To Adjacent "L" Head |
| 24D, 24B | $\theta$ | $6\theta$ |
| 24C, 24A | $\theta$ | $2\theta$ |
| "L" Heads | To Adjacent "S" Head | To Adjacent "M" Head |
| 26A, 26B | $\theta$ | $2\theta$ |

As is understood from FIG. 2, provided that the table 16 is rotated by 180 degrees about the rotation axis 17, the relative angular position of each one of the three groups 22, 24, 26 with respect to each of the other two groups is maintained, although the two diametrically opposite heads of each of the seven pairs, (22A, 22E), (22H, 22D), (22G, 22C), (22F, 22B), (24D, 24B), (24C, 24A), (26A, 26B), are replaced with each other. Therefore, the two heads of each of the pair or pairs belonging to each one of the three groups 22, 24, 26, have the same angular position with respect to the heads of the other two groups, as indicated in TABLE I.

The third area 146c of the first RAM 146 stores data used for identifying which mounting head 22, 24, 26 is held in Place I based on a rotation amount of the table 16 measured by the detector 156. As previously described, the detector 156 measures a rotation amount of the table 16 by using the "L" heads 26A, 26B as reference points. The third area 146c stores the following data:

TABLE II

| Rotation Amounts From Head 26A, 26B | Heads |
|---|---|
| $\theta$ | 22A, 22E |
| $2\theta$ | 24D, 24B |
| $3\theta$ | 22H, 22D |
| $4\theta$ | None |
| $5\theta$ | 22G, 22C |
| $6\theta$ | 24C, 24A |
| $7\theta$ | 22F, 22B |

For the previously described reason, the two heads of each of the six pairs, (22A, 22E), (22H, 22D), (22G, 22C), (22F, 22B), (24D, 24B), (24C, 24A), of the first and second groups 22, 24 have the same angular position with respect to the "L" heads 26A, 26B of the third group 26. By utilizing the predetermined angular distance of each of the "S" and "M" heads 22, 24 as measured from the "L" heads 26A, 26B, the mounting head 22, 24, 26 held in Place I, can be identified based on a rotation amount of the table 16 measured by the detector 156. Although in the present embodiment which one of the two heads of each of the seven pairs is held at Place I, cannot be identified, this identification is not essential for carrying out the electronic component mounting operation.

As is apparent from the foregoing, the two heads of each of the seven pairs of the three groups 22, 24, 26 are operated in the same way. Therefore, the following description is made with respect to one of the two heads of each pair.

Figure 8:
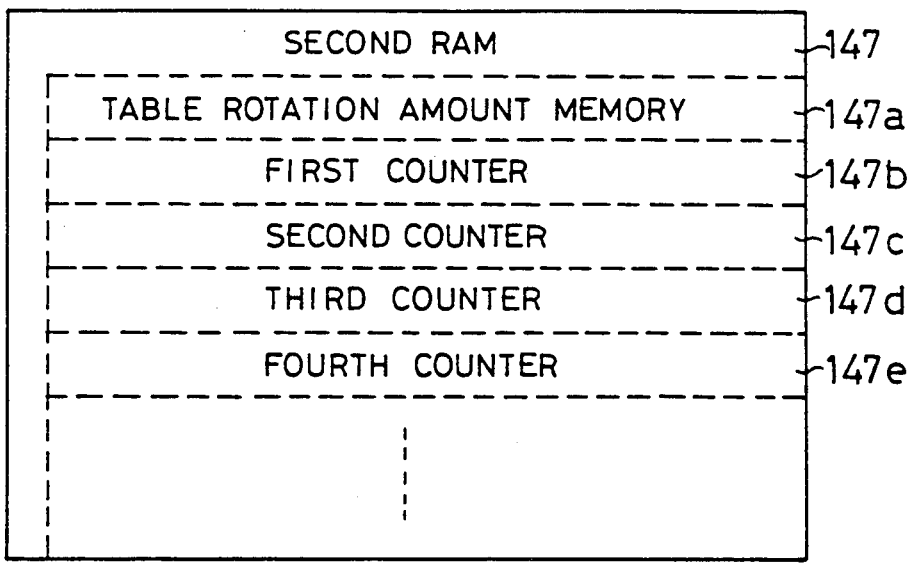
FIG. 8 is an illustrative view of a RAM of the computer of FIG. 6.

FIG. 8 shows a table rotation amount memory 147a and a first, a second, a third, and a fourth counter 147b, 147c, 147d, 147e, of the second RAM 147, which further has a working memory (not shown). FIG. 9 shows an electronic component mount program stored in the ROM 144. The ROM 144 also stores a first and a second head group change program shown in FIGS. 10 and 11, respectively.

There will be described the electronic component mounting operation carried out by the apparatus constructed as described above, by reference to the flow chart of FIG. 9, and further described is the head group changing operation carried out by the present apparatus, by reference to the flow charts of FIGS. 10 and 11.

In the electronic component mounting operation, initially, the control of the CPU 142 begins with Step S1 of the flow chart of FIG. 9, in which step the table 16 is rotated by the DD motor 12 until the motor rotation amount detector 156 resets its content to zero, namely, until one of the "L" heads 26A, 26B is moved to Place I. Step S1 is followed by Step S2 in which data indicative of the sort of an electronic component to initially be mounted is supplied from the printed wiring board control device 154 to the control device 140. Step S2 is followed by Step S3 in which the CPU 142 controls the DD motor 12 via the first drive circuit 160 to move to Place I one of the mounting heads of the group 22, 24, 26 which one group corresponds to the sort of the electronic component to initially be mounted that is most closely adjacent, or related, to Place I as viewed in the rotation direction R, according to the data stored in the second area 146b of the first RAM 146. In the event that a mounting head of the third group 26 is used, for example, the table 16 is not rotated because one of the "L" heads 26A, 26B of the third group is already positioned at Place I. In the event that a mounting head of the second or first group 24, 22 is required, data indicative of the angular distance between the "L" head 26A, 26B and the adjacent, or closest related, mounting head of the required group 24, 22, is read from the second area 146b, so that the table 16 is rotated by a rotation amount equal to the read angular distance. Thus, a desired mounting head 22, 24, 26 is moved to Place I (electronic component suck place).

Step S3 is followed by Step S4 in which data indicative of the equiangular distance between the mounting heads predetermined for the group to which the mounting head to initially be used belongs is read from the first area 146a of the first RAM 146. Subsequently, the control of the CPU 142 proceeds with Step S5 in which a mounting head held at Place I is operated for sucking an electronic component and a mounting head held at Place II is operated for mounting an electronic component on the board 124.

In the electronic component sucking operation, initially, the previously described, first push member is moved downward with a mounting head held at Place I until the tip of the sucking device 46, 72, 82 of the mounting head contacts an electronic component, and subsequently the selector valve is switched into the position allowing the vacuum to be supplied to the sucking device, whereby the mounting head sucks the electronic component by means of the vacuum. In the meanwhile, in the electronic component mounting operation, initially, the second push member is moved downward with a mounting head held at Place II (electronic component mount place) until an electronic component held by the sucking device 46, 72, 82 contacts the board 124, and subsequently the selector valve is switched into the position allowing the ambient air under atmospheric pressure to be supplied to the sucking device, whereby the mounting head releases the electronic component on the board 124. When a mounting head holding an electronic component is moved from Place I to Place II, the image pickup device 130 takes a projected image of the electronic component held by the mounting head. Based on the projected image, position and rotation errors of the electronic component are determined. For eliminating the position error of the electronic component, the X-Y table 122 is translated in the directions X, Y and the rotatable table associated with the X-Y table 122 is rotated. Thus, the electronic component is mounted on the board 124 with sufficient position accuracy.

After an electronic component has been mounted on the board 124, the control proceeds with Step S6 in which it is judged whether or not it is needed to change the head group 22, 24, 26 from that currently being used (hereinafter, referred to as the "current group"), to another, based on a head group change signal supplied from the board control device 154. The board control device 154 has data indicative of the sorts and numbers of the electronic components to be mounted on the printed wiring board 124, data indicative of the movement amounts of the X-Y table 122 necessary for bringing, into Place II, respective portions of the board 124 on which electronic components are mounted, and so on. The board control device 154 generates a head group change signal at a time after the mounting head held at Place I has sucked an electronic component and before the table 16 is rotated for moving the mounting head forward from Place I. In the event that no head group change is needed, namely, in the event that the judgement in Step S6 is negative (NO), the control goes to Step S7 in which it is judged whether or not the overall mounting operation has been completed. In the event that the judgement in Step S7 is negative, the control returns to Step S5 in which the electronic component sucking and mounting operation is effected. So long as a head group change is not needed and the overall mounting operation is not ended, Steps S5-S7 are repeated. Thus, the table 16 is rotated intermittently by the intermittent rotation amount equal to the equiangular distance between the mounting heads predetermined for the current group 22, 24, 26. Each time the table 16 is rotated by the intermittent rotation amount, one of the mounting heads of the current group sucks an electronic component at Place I and concurrently the diametrically opposite, corresponding mounting head of the same group mounts an electronic component on the board 124 at Place II. In Step S5, normally, the electronic component sucking and mounting operation begins with an intermittent rotation of the table 16 by the rotation amount equal to the equiangular distance predetermined for the current group. However, no rotation of the table 16 is needed when the initial one of the same electronic components of a certain sort is sucked, because the mounting head for sucking the initial electronic component has already been held at Place I.

In the event that the printed wiring board control device 154 generates a head group change signal, the judgement in Step S6 turns affirmative (YES), and the control of the CPU 142 goes to Step S8 in which it is judged whether or not the equiangular distance between the mounting heads predetermined with respect to a group which is to be subsequently used, or next used, in mounting the electronic components, (hereinafter, referred to as the "subsequent" group) is greater than that of the current group. Since in the present embodiment the three groups 22, 24, 26 of mounting heads are supported by the table 16 with the different equiangular distances, $2\theta$, $4\theta$ and $8\theta$, respectively, there can be the two cases; the first case in which the equiangular distance of the subsequent group is greater than that of the current group, and the second case in which the former is smaller than the latter. If the judgement in Step S8 is affirmative, the control goes to Step S9, a first head group change routine. On the other hand, if the judgement in Step S8 is negative, the control goes to Step S10, a second head group change routine. The flow charts of the first and second head group change routines are illustrated in FIGS. 10 and 11, respectively.

In the present embodiment, the head group changing operation is carried out in such a manner that the electronic component mounting operation and the electronic component sucking operation concurrently are carried out by the mounting heads of the current group and the mounting heads of the subsequent group. More specifically, all the components that are held by the mounting heads of the current group situated between Place I and Place II when a head group change signal is generated, are mounted on the board 124 at Place II, while concurrently the mounting heads of the subsequent group are stopped at Place I so as to suck the electronic components of the corresponding sort.

There will be described the head group changing operation carried out by the present apparatus with respect to the above indicated first case, by reference to the flow chart of FIG. 10. In the event that the first group 22 is changed to the second group 24, for example, the apparatus carries out two different operations depending upon which "S" head of the first group 22 is held at Place I at the time of generation of the head group change signal, because two "S" heads 22 are provided between each pair of adjacent two "M" heads of the second group 24. Accordingly, first, in Step S101 it is identified which "S" head 22 of the first group is held at Place I, based on a motor rotation amount measured by the detector 156 and the data stored in the third area 146c of the first RAM 146 (TABLE II). Step S101 is followed by Step S102 in which an angular distance $\alpha$ between the identified "S" head 22, and the "M" head 24 which is adjacent, or most closely related to, to the "S" head 22 on the rear side of the "S" head 22 as viewed in the rotation direction R of the table 16, is read from the second area 146b of the first RAM 146 (see TABLE I). If a head group change signal is generated in the situation shown in FIG. 2, it is determined from the motor rotation amount measured by the detector 156 that the rotation amount of the table 16 is $\theta$, and further it is determined from the data stored in the third area 146c that the mounting head held at Place I is the "S" head 22A (or 22E). Further, it is determined from the second area 146b that the "M" head 24D is adjacent to the "S" head 22A and therefore the angular distance $\alpha$ therebetween is $\theta$.

Step S102 is followed by Step S103 in which the angular distance $\alpha = \theta$ is divided by the equiangular distance, $2\theta$, predetermined for the current, first group 22, so as to determine a quotient N (whole number or integer) and a remainder $\beta$. Thus, it is determined how many intermittent rotations of the table 16 each by the intermittent rotation amount $2\theta$, are needed for moving the adjacent "M" head 24D to Place I where at present the "S" head 22A is held. Subsequently, in Step S104 it is judged whether or not the number N is greater than zero. If the judgement in Step S104 is affirmative, namely, if the number N is greater than zero, steps S105-S108 are implemented so that the table 16 intermittently is rotated by N times by the intermittent rotation amount $2\theta$ which equal to the equiangular distance of between mounting heads the current, first group 22 for each of the N times intermittent rotations, whereby the "S" components held by the "S" heads 22 are mounted on the board 124 at Place II. Specifically, in Step S105 the table 16 is rotated one time by the intermittent rotation amount $2\theta$ and the content of the table rotation amount memory 147a of the second RAM 147 is incremented by the rotation amount $2\theta$. In Step S106 the "S" component held by one of the "S" heads 22 is mounted on the board 124 at Place II, and in Step S107 the content C1 of the first counter 147b of the second RAM 147 is incremented by one. Subsequently, in Step S108 it is judged whether or not the content C1 is equal to, or greater than, the number N. If the judgement in Step S108 is affirmative, Step S108 is followed by Step S109 in which the content C1 of the first counter 147b is reset to zero.

Step S109 is followed by Step S110 in which the table 16 is rotated by the remainder $\beta$ determined in Step S103 so that the adjacent "M" head 24 ("M" head 24D) is moved to, and held at, Place I. This means that the intermittent rotation amount by which the table 16 intermittently is rotated, is changed from a rotation amount equal to the equiangular distance $2\theta$ predetermined for the first group 22, to a different rotation amount equal to the remainder $\beta$. In the present head group change case in which the equiangular distance of the subsequent group is greater than that of the current group, the table 16 is rotated by a rotation amount equal to the smaller one (e.g., $2\theta$) of the equiangular distances predetermined for the current and subsequent groups, for moving each of the mounting heads of the current group to Place II, and concurrently is rotated by a different rotation amount (e.g., $\beta$) for moving the adjacent mounting head of the subsequent group to Place I. In other words, if any one of the mounting heads of the current group is moved to Place II before the adjacent mounting head of the subsequent group is moved to Place I, each of those mounting heads of the current group is stopped at Place II for mounting on the board 124 the electronic component that has been held thereby. Since in the example of FIG. 2 the head group changing operation is started with the "S" head 22A of the first group held at Place I, the number N=0 and the rotation amount $\beta = \theta$ are determined in Step S103. Therefore, the judgement in Step S104 is negative, and the control of the CPU 142 skips Steps S105-S109 and goes to Step S110 in which the table 16 is rotated by the rotation amount $\beta = \theta$ so that the "M" head 24D is moved to Place I where the "M" head 24D sucks an "M" component 116. The content of the table rotation amount memory 147a is incremented by the rotation amount $\beta$. While the table 16 is rotated for moving the "M" head 24D to Place I, the electronic component supply table 100 is moved along the path A so that the unit 104 for supplying the "M" components 116 is brought into the electronic component supply place.

Step S110 is followed by Step S111 in which the adjacent mounting head ("M" head 24D) is pushed downward for sucking the "M" component and is moved upward due to the biasing force of the spring 44 after the sucking. Subsequently, in Step S112 the table 16 is rotated by a rotation amount ($\theta$) determined by subtracting the remainder $\beta(=\theta)$ from the equiangular distance ($2\theta$) of the current group, so that the "S" head 22D holding the "S" component is moved to Place II. The content of the table rotation amount memory 147a is incremented by the rotated rotation ($\theta$). In the situation in which the above indicated, adjacent mounting head of the subsequent group is held at Place I, none of the mounting heads of the current group can be held at Place II. In the event that there is still left between Place I and Place II any mounting head of the current group that holds the electronic component, it is required to change the intermittent rotation amount from the rotation amount equal to the remainder ($\beta$) to the equiangular distance ($2\theta$) of the current group.

Step S112 is followed by Step S113 in which one of the mounting heads of the current group ("S" head 22D) is moved downward for mounting the electronic component ("S" component) on the board 124 and is moved upward due to the biasing force of the spring 44 after the mounting. Step S113 is followed by Step S114 in which it is judged whether or not the rotation amount of the table 16 has exceeded a predetermined value (hereinafter, referred to as the "cycle rotation amount") equal to the greater one of the equiangular distances predetermined with respect to the current and subsequent groups. In the present case, the cycle rotation amount is the equiangular distance of the subsequent group (e.g., equiangular distance $4\theta$ of the second group 24). Since the table 16 has been rotated by $\theta$ in each of Steps S110 and S112, the total rotation amount of the table 16 is $2\theta$. Therefore, the judgement in Step S114 is negative, and the control goes to Step S115.

In Step S115 a rotation amount determined by subtracting the content of the memory 147a, namely, accumulated rotation amount of the table 16, from the subsequent cycle rotation amount, is divided by the equiangular distance of the current group to obtain a quotient M (whole number or integer). Since the number of the mounting head or heads of the subsequent group which can be provided within the range of the cycle rotation amount is one, the intermittent rotation amount changing operation is carried out one time, for moving the adjacent mounting head of the subsequent group to Place I. After Steps S110-S113, the table 16 is rotated by M times by the intermittent rotation amount equal to the equiangular distance of the current group for each time, until the content of the table rotation memory 147a coincides with the subsequent cycle rotation amount. In this process, each of the mounting heads of the current group which carries the electronic components mounts the electronic component on the board 124 at Place II.

In the example shown in FIG. 2, the number M=1 is determined in Step S115. Therefore, the control goes to Step S116 in which the table 16 is rotated by the rotation amount $2\theta$ so that the "S" head 22C is moved to Place II, and in Step S117 the "S" head 22C mounts the "S" component on the board 124.

Step S117 is followed by Step S118 in which the content C2 of the second counter 147c of the second RAM 147 is incremented by one. Subsequently, in Step S119 it is judged whether or not the content C2 is equal to, or greater than, the number M. If the content C2 is smaller than the number M, the control of the CPU 142 returns to Step S116, whereby the table 16 is rotated by the rotation amount equal to the equiangular distance of the current group and the electronic component held by one of the mounting heads of the current group is mounted on the board 124.

In the example of FIG. 2, since the number M is one as described above, the judgement in Step S119 is affirmative. Accordingly, the control goes to Step S120 in which the content C2 is reset to zero, and in Step S121 the content C3 of the third counter 147d of the second RAM 147 is incremented by one. The third counter 147d counts a quotient T (whole number or integer) determined by dividing an angular distance ($8\theta$) between Place I and Place II by the subsequent cycle rotation amount ($4\theta$).

In the present embodiment, the number T is two because the angular distance between Place I and Place II is $8\theta$ and the cycle rotation amount is $4\theta$. Therefore, the judgement in Step S122 is negative, and Step S122 is followed by Step S123 in which the content of the table rotation amount memory 147a is reset to zero. Then, the control of the CPU 142 goes back to Step S104 and the following Steps 105-S121, so that the "M" head 24C is moved to Place II where the "M" head 24C sucks an "M" component 116, and that the "S" heads 22B, 22A are moved in order to Place II where the "S" heads 22B, 22A mount the "S" components 118 in order on the board 124. Thus, all the "S" components held by the "S" heads 22 situated between Place I and Place II when the head group change signal is generated by the board control device 154, are mounted on the board 124. In this way, the judgement in Step S122 turns affirmative.

If the judgement in Step S122 is affirmative, the control goes to Step S124 in which the content C3 of the third counter 147d is reset to zero, and subsequently in Step S125 the content C4 of the fourth counter 147e is incremented by one. Step S125 is followed by Step S126 in which it is judged whether or not the content C4 is equal to, or greater than, a quotient U (whole number or integer) determined by dividing the angular distance between Place I and Place II by an angular distance between the two "L" heads 26A, 26B. As a result of execution of Steps S104-S125, the mounting head held at Place I when a head group change signal is generated, is rotated by the rotation amount equal to the angular distance between the two "L" heads 26A, 26B. Therefore, if the number U is more than one, it is required to repeat Steps S104-S125 by U times, for moving to Place II the mounting head which is held at Place I when a head group change signal is generated. Therefore, it can be said that in Step S126 it is judged whether or not Steps S104-S125 have been carried out by the U times.

In the present apparatus, the number U is one because the angular distance between Place I and Place II is $8\theta$, and the angular distance between the two "L" heads 26A 26B is $8\theta$, too. Therefore, the judgement in Step S126 is affirmative. Step S126 is followed by Step S127 in which the content C4 of the fourth counter 127d is reset to zero. Subsequently, in Step S128 the table 16 is rotated by the intermittent rotation amount equal to the angular distance $\alpha$. Thus, a pair of diametrically opposite mounting heads of the subsequent group are moved to, and held at, Place I and Place II, respectively. This means the completion of the head group changing operation.

In the example of FIG. 2, the head group changing operation is completed when the "M" heads 24B, 24D are held at Place I and Place II, respectively. After Step S128, the control of the CPU 142 returns to Step S5 of FIG. 9, so that the table 16 is rotated by the intermittent rotation amount equal to the equiangular distance ($4\theta$) of the subsequent group for each of the intermittent rotations thereof, whereby the "M" components are sucked from the supply unit 108 at Place I and mounted on the board 124 at Place II.

Figure 12:
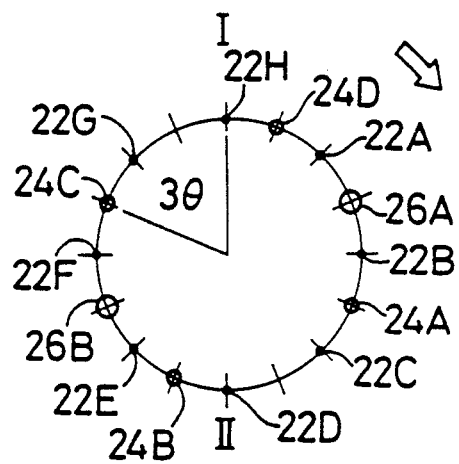
FIGS. 12-21 are views for illustrating the different head group changing operations carried out by the apparatus of FIG. 1.

Next, there will be described the head group changing operation for changing the first group to the second group with respect to the situation shown in FIG. 12 in which a head group change signal is generated with the "S" head 22H held at Place I. In Step S101, that the "S" head 22H is held at Place I is identified based on a rotation amount of the table 16 as measured from the reference point ("L" head 26A) which amount is measured by the detector 156. Subsequently, in Step S102 the angular distance $\alpha = 3\theta$ is determined based on the data stored in the second area 146b. In Step S103 the number $N = 1$ and the rotation amount $\beta = \theta$ are determined. Then, the cycle of Steps S105-S108 is carried out one time so that the "S" component held by the "S" head 22C is mounted on the board 124 at Place II. Further, Steps S110-S113 are executed so that the adjacent "M" head 24C is held at Place I and sucks an "M" component 116 and subsequently the "S" head 22B is held at Place II and mounts the "S" component 118 on the board 124. As a result of execution of Steps S105-S108 the table 16 is rotated by $2\theta$, and as a result of execution of each of Steps S110 and S112 the table 16 is rotated by $\theta$. Thus, as a result of execution of Steps S105-S113 the table 16 is rotated by $4\theta$. Therefore, the judgement in Step S114 is affirmative (YES), and the control of the CPU 142 skips Steps S115-S120 and goes to Step S121. Since the cycle number T is two, the judgement in Step S122 is negative (NO), and the cycle of Steps S104-S114 is carried out once more, and in Step S128 the table 16 is rotated by the intermittent rotation amount equal to the angular distance $\alpha = 3\theta$. Thus, the head group changing operation is completed.

Figure 10C:
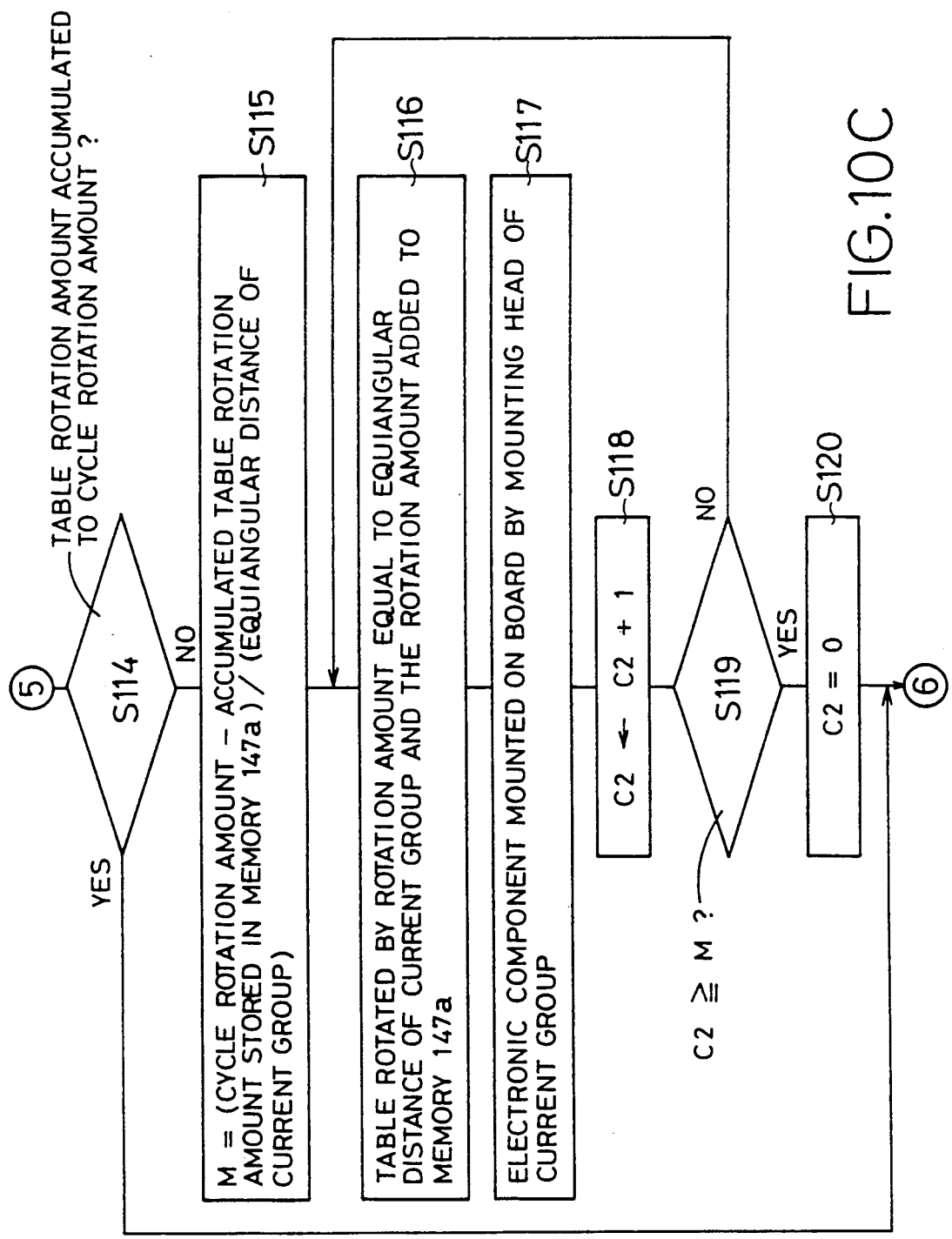
FIGS. 10 (10A-10D) and 11 (11A-11C) show the flow charts of different head group change programs stored in the ROM of FIG. 6.

The flow chart of FIG. 10 also applies to the head group changing operations for changing the first group to the third group and for changing the second group to the third group. Since four "S" heads 22 of the first group are provided between the two "L" heads 26 of the third group, the apparatus carries out four different operations for changing the first group to the third group. Similarly, since two "M" heads 24 of the second group are provided between the two "L" heads 26 of the third group, the apparatus carries out two different operations for changing the second group to the third group.

Figure 13:
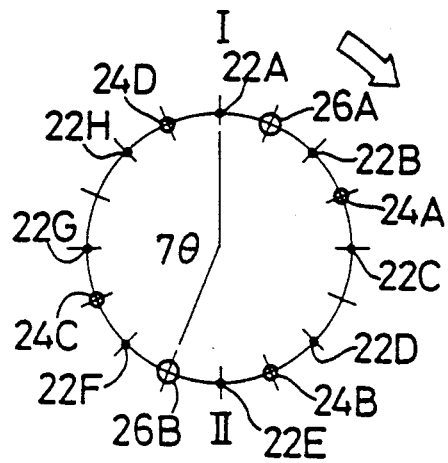

First, there will be described the head group changing operation from the first group to the third group with respect to the example shown in FIG. 13 in which a head group change signal is generated when the "S" head 22A is held at Place I. In this example, the angular distance $\alpha = 7\theta$, the number $N = 3$, and the rotation amount $\beta = \theta$ are determined in Steps S102 and S103. The cycle of Steps S105-S108 is repeated three times so that the table 16 is rotated by the rotation amount $2\theta$ for each of the three times, namely, that the "S" heads 22D, 22C, 22B mount the "S" components 118 on the board 124 at Place II. Subsequently, in Step S110 the table 16 is rotated by the rotation amount $\theta$ so that the "L" head 26B is moved to, and held at, Place I. In Step S111 the "L" head 26B sucks an "L" component 114. In Step S112 the table 16 is rotated by the rotation amount $\theta$ so that the the "S" head 22A is held at Place II, and in Step S113 the "S" head 22A mounts the "S" component 118 on the board 124. Since in this example the cycle number T is one, and since in the present apparatus the unit number U is one, the judgements in both Steps S122 and S126 are affirmative. Therefore, in Step S128 the table 16 is rotated by the rotation amount $7\theta$. Thus, the head group changing operation is ended.

Figure 14:
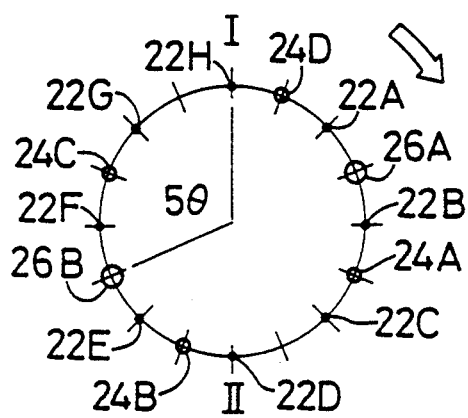

Next, with respect to the example of FIG. 14 in which a head group change signal is generated when the "S" head 22H is held at Place I, the head group changing operation from the first head group to the third head group will be described. In this example, the angular distance $o = 5\theta$, the number $N=2$, the rotation amount $\beta=\theta$, the number $M=1$, and the number $T=1$ are determined in Steps S102, S103, S115 and S122. Accordingly, the cycle of Steps S105–S108 is carried out two times so that the table 16 is rotated by the rotation amount $2\theta$ for each of the two times, namely, that the "S" heads 22C, 22B mount the "S" components 118 on the board 124 at Place II. Subsequently, in Step S110 the table 16 is rotated by the rotation amount $\theta$ so that the "L" head 26B is moved to, and held at, Place I. In Step S111 the "L" head 26B sucks an "L" component 114. In Step S112 the table 16 is rotated by the rotation amount $\theta$ so that the "S" head 22A is moved to, and held at, Place II, and in Step S113 the "S" head 22A mounts the "S" component 118 on the board 124. Further, the cycle of Steps S116–S119 is carried out one more time so that the "S" head 22H is moved to, and held at, Place II and mounts the "S" component 118 on the board 124. Finally, in Step S128 the table 16 is rotated by the rotation amount $5\theta$, and the head group changing operation is ended.

Figure 15:
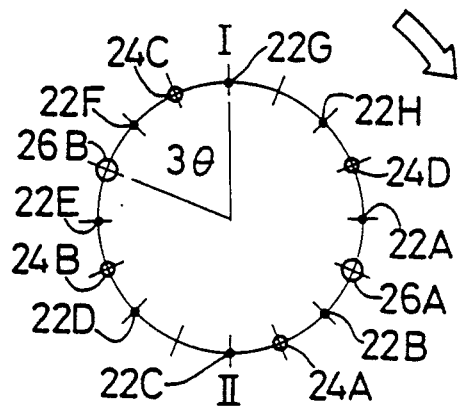

Further, with respect to the example of FIG. 15 in which a head group change signal is generated when the "S" head 22G is held at Place I, the head group changing operation for changing the first head group to the third head group will be described. In this example, the angular distance $\alpha=3\theta$, the number $N=1$, the rotation amount $\beta=\theta$, the number $M=2$, and the number $T=1$ are determined in Steps S102, S103, S115 and S122. The cycle of Steps S105–S108 is carried out one time so that the table 16 is rotated by the rotation amount $2\theta$, namely, that the "S" head 22B mounts the "S" component 118 on the board 124 at Place II. Subsequently, in Step S110 the table 16 is rotated by the rotation amount $\theta$ so that the "L" head 26B is moved to, and held at, Place I. In Step S111 the "L" head 26B sucks an "L" component 114. In Step S112 the table 16 is rotated by the rotation amount $\theta$ so that the "S" head 22A is held at Place II, and in Step S113 the "S" head 22A mounts the "S" component 118 on the board 124. Further, the cycle of Steps S116–S119 is carried out two times so that the "S" heads 22H, 22G are moved to, and held at, Place II and mount the "S" components 118 on the board 124. In Step S128 the table 16 is rotated by the rotation amount $3\theta$, and thus the head group changing operation is ended.

Figure 16:
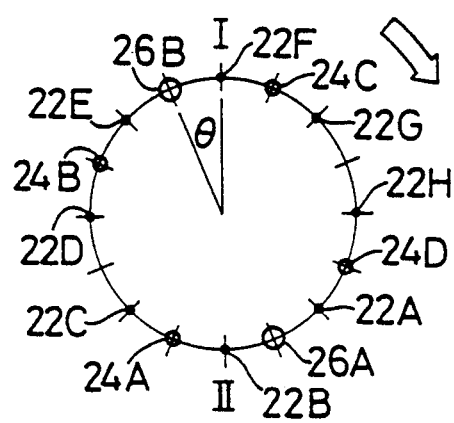

With respect to the example of FIG. 16 in which a head group change signal is generated when the "S" head 22F is held at Place I, the head group changing operation for changing the first head group to the third head group will be described. In this example, the angular distance $\alpha=\theta$, the number $N=0$, the rotation amount $\beta=\theta$, the number $M=3$, and the number $T=1$ are determined in Steps S102, S103, S115 and S122. The cycle of Steps S105–S108 is skipped. In Step S110 the table 16 is rotated by $\theta$ so that the "L" head 26B is held at Place II. In Step S111 the "L" head 26B sucks an "L" component 114. In Step S112 the table 16 is rotated by $\theta$ so that the "S" head 22A is held at Place II, and in Step S113 the "S" head 22A mounts the "S" component 118 on the board 124. Further, the cycle of Steps S116–S119 is carried out three times so that the "S" heads 22H, 22G, 22F are held in order at Place II and mount the "S" components 118 on the board 124. In Step S128 the table 16 is rotated by $\theta$, and thus the head group changing operation is ended.

Figure 17:
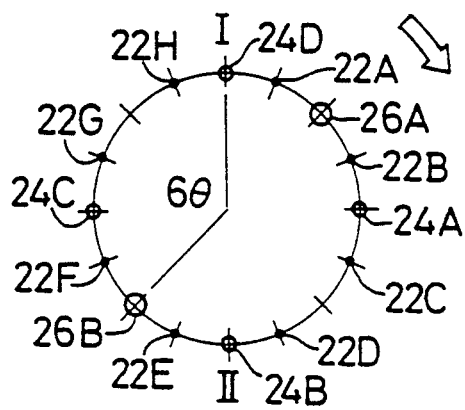

Next, the head group changing operation for changing the second head group to the third head group will be described with respect to the example of FIG. 17 in which a head group change signal is generated when the "M" head 24D is held at Place I. In this example, the angular distance $\alpha=6\theta$, the number $N=1$, the rotation amount $\beta=2\theta$, the number $M=0$, and the number $T=1$ are determined in Steps S102, S103, S115 and S122. The cycle of Steps S105–S108 is carried out one time so that the "M" head 24A mounts the "M" component 116 on the board 124 at Place II. In Step S110 the table 16 is rotated by $3\theta$ so that the "L" head 26B is held at Place I. In Step S111 the "L" head 26B sucks an "L" component 114. In Step S112 the table 16 is rotated by $2\theta$ so that the "M" head 24D is held at Place II, and in Step S113 the "M" head 24D mounts the "M" component 116 on the board 124. Further, in Step S128 the table 16 is rotated by $6\theta$ so that the "L" head 26A is moved to Place I. Thus, the head group changing operation is ended.

Figure 18:
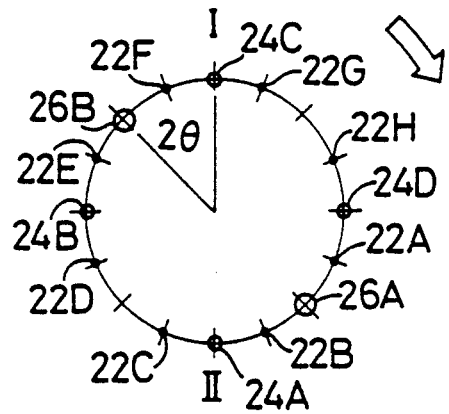

Next, with respect to the example of FIG. 18 in which a head group change signal is generated when the "M" head 24C is held at Place I, the head group changing operation for changing the second head group to the third head group will be described. In this example, the angular distance $\alpha=2\theta$, the number $N=0$, the rotation amount $\beta=2\theta$, the number $M=1$, and the number $T=1$ are determined in Steps S102, S103, S115 and S122. The cycle of Steps S105–S108 are skipped. In Step S110 the table 16 is rotated by $2\theta$ so that the "L" head 26B is held at Place I. In Step S111 the "L" head 26B sucks an "L" component 114. In Step S112 the table 16 is rotated by $2\theta$ so that the "M" head 24D is held at Place II, and in Step S113 the "M" head 24D mounts the "M" component 116 on the board 124. Subsequently, the cycle of Steps S116–S119 is carried out one time so that the "M" head 24C is held at Place II and mounts the "M" component 16 on the board 124. Further, in Step S128 the table 16 is rotated by $3\theta$ so that the "L" head 26A is moved to Place I. Thus, the head group changing operation is ended.

Next, there will be described the previously described, second case in which the equiangular distance of the subsequent group is smaller than that of the current group. This head group changing operation is carried out according to the flow chart of FIG. 11.

Figure 19:
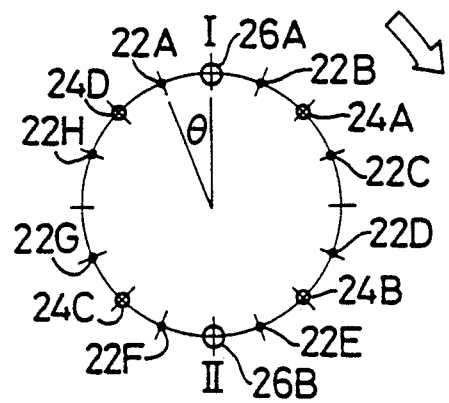

First, the head group changing operation for changing the third head group to the first head group will be described with respect to the example of FIG. 19 in which a head group change signal is generated when the "L" head 26A is held at Place I. In Step S201, the angular distance $\alpha=\theta$ is determined in a manner similar to that of Step S102 of FIG. 10. That is, the angular distance $\alpha$ between the "L" head 26A of the third group held at Place I, and the "S" head 22A of the first group which is adjacent to the "L" head 26A on the rear side of the head "L" 26A as viewed in the rotation direction R of the table 16, is read from the second memory 146b (TABLE I). In Step S202 a value determined by subtracting the angular distance α from the cycle rotation amount, is divided by the equiangular distance of the subsequent group so as to obtain a quotient N' and a remainder α'. The cycle rotation amount used in Step S202 is the same as that used in Step S114 of FIG. 10, namely, the greater one of the equiangular distances of the current and subsequent groups. In this example, the cycle rotation amount is the equiangular distance 8θ of the third group, and the number N'=3 and the rotation amount β'=θ are determined in Step S202. Step S202 is followed by Step S203 in which the table 16 is rotated by the rotation amount α so that one of the mounting heads of the subsequent group ("S" head 22A of the first group) is moved to Place I. In Step S204 the mounting head held at Place II sucks an electronic component of the corresponding sort ("S" component 118). Subsequently, the cycle of Steps S205-S208 is carried out by N' times so that the table 16 is rotated by the intermittent rotation amount equal to the equiangular distance of the subsequent group for each of the N' times intermittent rotations and that the mounting heads of the subsequent group ("S" heads 22H, 22G, 22F of the first group) suck electronic components of the corresponding sort ("S" components) at Place I. Subsequently, in Step S210 the table 16 is rotated by the rotation amount β(θ) so that one of the mounting heads of the current head group ("L" head 26A) is moved to Place II. In Step S211 the mounting head held at Place II mounts the electronic component "L" component 114) on the board 124.

In the present head group change case in which the equiangular distance of the subsequent group is smaller than that of the current group, a plurality of mounting heads of the subsequent group are situated between one of the mounting heads of the current group held at Place I when a head group change is signal is generated, and an adjacent mounting head of the same group as viewed in the rotation direction R. Therefore, before the mounting head or heads of the current group which is/are situated between Place I and Place II when a head group change signal is generated, is/are moved to Place II, the plurality of mounting heads of the subsequent group are moved to Place I. For moving the mounting heads of the subsequent group to Place I, it is required that the intermittent rotation amount by which the table 16 intermittently is rotated, be changed from the rotation amount equal to the equiangular distance of the current group to the rotation amount equal to the angular distance α. Subsequently, the intermittent rotation amount is changed again from the rotation amount αto the equiangular distance of the subsequent group, by which the table 16 intermittently is rotated by the N' times so that the mounting heads of the subsequent group suck the electronic components of the corresponding sort. Subsequently, one of the mounting heads of the current group which holds the electronic component is moved to Place II where the mounting head mounts the electronic component on the board 124.

The cycle number T' used in Step S213 of this program is the same as that used in Step S212 of the program of FIG. 10. With respect to the example of FIG. 19, the cycle number T' is one. Therefore, the judgement in Step S213 is affirmative. Further, in the present apparatus the unit number U is one as previously described. Therefore, the judgement in Step S216 is affirmative now after the execution of Steps S203-S215. In Step S218 the table 16 is rotated by the rotation amount α(θ) so that a pair of diametrically opposite mounting heads of the subsequent group are moved to Place I and Place II, respectively. Thus, the head group changing operation is finished.

Figure 20:
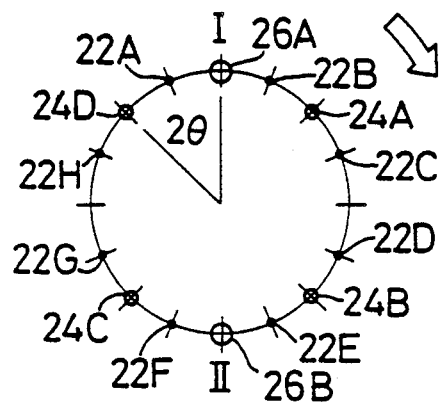

Next, the head group changing operation for changing the third head group to the second head group will be described with respect to the example of FIG. 20 in which a head group change signal is generated when the "L" head 26A is held at Place I. In this example, the angular distance α=2θ is determined in Step S201. The cycle rotation amount is 8θ, and the number N'=1 and the rotation amount β'=2θ are determined in Step S202. In Step S203 the table 16 is rotated by 2θ so that the "M" head 24D is moved to Place I. In Step S204 the "M" head 24D sucks an "M" component 116. Subsequently, the cycle of Steps S205-S208 is carried out one time so that the table 16 is rotated by 4θ and the "M" head 24C is moved to Place I, and that the "M" head 24C sucks an "M" component 116 at Place I. Subsequently, in Step S210 the table 16 is rotated by 2θ so that the "L" head 26A is moved to Place II. In Step S211 the "L" head 26A mounts the "L" component 114 on the board 124. Thus, the table 16 has been rotated by the cycle rotation amount 8θ. In Step S218 the table 16 is rotated by 2θ so that the "M" heads 24B, 24D are moved to Place I and Place II, respectively. Thus, the head group changing operation is finished.

Figure 21:
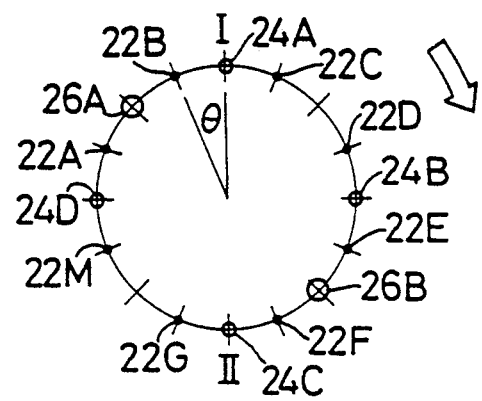

Further, the head group changing operation for changing the second head group to the first head group will be described with respect to the example of FIG. 21 in which a head group change signal is generated when the "M" head 24A is held at Place I. The angular distance α=θ is determined in Step S201. The cycle rotation amount is 4θ, and the number N'=1 and the rotation amount β'=θ are determined in Step S202. In Step 213 the cycle number T'=2 is determined. In Step S203 the table 16 is rotated by θ so that the "S" head 22B is moved to Place I. In Step S204 the "S" head 22B sucks an "S" component 118. Subsequently, the cycle of Steps S205-S208 is carried out one time so that the table 16 is rotated by 2θ for moving the "S" head 22A to Place I and that the "S" head 22A sucks an "S" component 118 at Place I. Subsequently, in Step S210 the table 16 is rotated by θ so that the "M" head 24B is moved to Place II. In Step S211 the "M" head 24B mounts the "M" component 116 on the board 124. Thus, the table 16 has been rotated by the cycle rotation amount 4θ. Since the cycle number T' is two in this example, the cycle of Steps S203-S212 is carried out one more time so that the "M" head 24A held at Place I is moved to Place II where the "M" head 24A mounts the "M" component 116 on the board 124. The judgements in both Steps S213 and S216 are affirmative. In Step S218 the table 16 is rotated by θ so that the "S" heads 22F, 22B are moved to Place I and Place II, respectively. Thus, the head group changing operation is finished.

In the present embodiment, the three groups of mounting heads 22, 24, 26 are supported by the table 16 such that the mounting heads of each of the three groups are spaced apart from each other by a corresponding one of the three different equiangular distances, 2θ, 4θ, 8θ. Accordingly, the normal, electronic component mounting (sucking and releasing) operation is carried out by the mounting heads of the each head group 22, 24, 26, while the mounting heads are moved to Places I, II as the table 16 is rotated by the intermittent rotation amount equal to the corresponding equiangular distance for each of the intermittent rotations thereof. In addition, the number of the small-size electronic components ("S" components) to be mounted on a printed wiring board is the largest of the three sorts, small-size, medium-size and large-size, as previously described. Accordingly, the number of the mounting heads of the first group 22, which serve for mounting the small-size electronic components, is the largest of the three head groups 22, 24, 26. Therefore, the mounting heads of the first group 22 are moved by the smallest intermittent rotation amount, 28, namely, the mounting heads of the first group 22 are moved to the electronic component suck and mount places (Place I and Place II) in a relatively short time. Thus, the efficiency of the normal mounting operation is improved.

Further, the present apparatus is operated in the manner that, at the time of a transition from one head group to another, the electronic component sucking and mounting operations concurrently are effected by the mounting heads of the current and subsequent groups. Thus, the head group changing operation (i.e., transitional mounting operation) is carried out in a short time as compared with the manner in which all the electronic components held by the mounting heads of the current group are mounted on a printed wiring board before the mounting heads of the subsequent group suck electronic components. That is, the efficiency of the transitional mounting operation is improved. Thus, the present apparatus exhibits excellent mounting efficiency with respect to both the normal and transitional mounting operations.

In the present embodiment, during the head group changing operation, the intermittent rotation amount is changed from the rotation amount equal to the equiangular distance predetermined with respect to the current group, to the rotation amount equal to the remainder $\beta$, $\beta'$, so that the mounting head or heads of the subsequent head group is/are stopped at Place I. However, except for the intermittent rotation or rotations for the above indicated, stopping or stoppings of the head or heads of the subsequent group at Place I, the table 16 is rotated by the rotation amount equal to the smaller one of the equiangular distances predetermined with respect to the current and subsequent groups. Therefore, the head group changing operation is completed in a short time as compared with the manner in which the concurrent sucking and mounting operations are effected as the table 16 is rotated intermittently by using a single, common intermittent rotation amount (in the present embodiment, $\theta$ or $2\theta$) which allows the mounting heads of both the current and subsequent groups to be stopped at Place I and Place II. In other words, the present apparatus completes the head group changing operation by stopping the table 16 fewer times. However, the apparatus may be operated in the above indicated, somewhat inefficient manner.

As emerges from the foregoing description, in the present embodiment, a portion of the ROM 144 which stores the programs, S101–S128 and S201–S218 of FIGS. 10 and 11, and the CPU 142 executing those programs cooperate with each other to serve as changing means for changing the intermittent rotation amount from one of a plurality of predetermined rotation amounts to another of the same.

Figure 22:
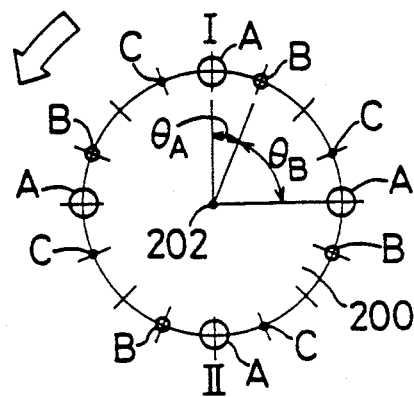
FIG. 22 is a view for the head group changing operation carried out by another embodiment of the present invention.

Another embodiment of the present invention is illustrated in FIG. 22. In this embodiment, three sorts of mounting heads A, B, C are supported by a table 200 rotatable about an axis 202, such that the four mounting heads of each one of the three sorts are spaced apart from each other by an equiangular distance, 90 degrees, equal to that of each of the other two sorts. In the event that the head sort change from the sort A to the sort B is carried out, the electronic component mounting and sucking operations concurrently are effected by the mounting heads of the sort A and the sort B, respectively, as the table 200 is rotated by the intermittent rotation amount which is alternately changed between the different rotation amounts, $\theta_A$ and $\theta_B$ indicated in the figure. Alternatively, it is possible to effect the above indicated concurrent mounting and sucking operations by rotating the table 200 by a single common intermittent rotation amount $\theta_A$ that allows the mounting heads of both the sorts A and B to be stopped at Place I and II. While in the preceding embodiment each of the mounting heads of the third group 26, which group consists of the smallest number of mounting heads, is used as the reference head for measuring a rotation amount of the table 16 based on which a mounting head held at Position I is identified, in the instant embodiment two of the four mounting heads of one of the three head sorts A, B, C are used for the same purpose. Generally, it is possible to use for this purpose at least one of the mounting heads of one of the different head groups or sorts which one head group consists of the smallest number of mounting heads.

Although in the illustrated embodiments the position error of an electronic component held by a mounting head is detected while the mounting head is moved, it is possible to adapt the apparatus to detect it while the mounting head is stopped.

Further, it is possible to replace the mounting head 22, 24, 26 and the image pickup device 130 employed in the illustrated embodiments, with an arrangement disclosed in Japanese Utility Model Application laid open under Publication No. 1(64)-26900 in which the mounting head includes a sucking pipe which extends through the thickness of a light emitter, and a light diffusing plate secured to the free end of the sucking pipe. In the disclosed arrangement, the light emitted from the light emitter is diffused by the light diffusing plate, so that the diffused light is used for irradiating an electronic component held by the mounting head and thereby producing a projected image of the electronic component. Furthermore, it is possible to use a mounting head of the jaw chuck type in place of the suction type mounting head 22, 24, 26 used in the illustrated embodiments.

While the present invention has been described in detail in its presently preferred embodiments, it is to be understood that the present invention is by no means limited to the details of the illustrated embodiments and that the present invention may be embodied with other changes, modifications and improvements that occur to those skilled in the art without departing from the spirit and scope of the invention as defined in the appended claims.

What is claimed is:

1. An apparatus for mounting different sorts of electronic components on a substrate, comprising:

a table rotatable about an axis;

a plurality of groups of mounting heads supported by said table, each of the head groups consisting of a plurality of identical mounting heads different from the mounting heads of the other head group or groups, the mounting heads of said each head group taking an electronic component of a corresponding one of said different sorts, from an electronic component supply device, and mounting said electronic component on a substrate, said mounting heads of said each head group being supported by said table such that said mounting heads of said each head group are equiangularly distant from each other on a circle whose center is located on said axis of said table;

drive means for intermittently rotating said table about said axis, said drive means rotating said table by one of a plurality of predetermined rotation amounts for each of the intermittent rotations thereof, said plurality of rotation amounts including a rotation amount equal to the equiangular distance predetermined with respect to said mounting heads of said each head group; and changing means for changing from said one of said rotation amounts to another of said rotation amounts.

2. The apparatus as set forth in claim 1, wherein the equiangular distance predetermined with respect to the mounting heads of said each head group is different from the equiangular distance predetermined with respect to the mounting heads of each of the other head group or groups.

3. The apparatus as set forth in claim 1, wherein each of the mounting heads of said each head group is related to a closest one of the mounting heads of each of said other head group or groups on the rear side of said each mounting head of said each head group as viewed in a direction of rotation of said table, said rotation amounts further including a rotation amount equal to a predetermined angular distance between said closest one mounting head of said each of said other head group or groups, and a closest one of the mounting heads of said each head group on the front side of said closest one mounting head of said each of said other head group or groups as viewed in the rotation direction of said table.

4. The apparatus as set forth in claim 1, wherein said head groups comprise a first, a second and a third head group, the number of the mounting heads of said third head group being twice the number of the mounting heads of said second head group, the number of the mounting heads of said second head group being twice the number of the mounting heads of said first head group.

5. The apparatus as set forth in claim 4, wherein said first, second and third head groups consist of two, four and eight mounting heads, respectively, the fourteen mounting heads of said first, second and third head groups being disposed at fourteen locations out of sixteen locations which are equiangularly distant from each other on said circle.

6. The apparatus as set forth in claim 5, wherein the mounting heads of said first, second and third head groups take a large-size, a medium-size and a small-size electronic component from said electronic component supply device, respectively, and mount said large-size, medium-size and small-size electronic components on said substrate, respectively.

7. The apparatus as set forth in claim 1, wherein said table includes an even number of mounting head support portions, the mounting head support portions supporting said mounting heads of said head groups such that the number of said mounting heads is smaller than the number of said mounting head support portions.

8. The apparatus as set forth in claim 1, further comprising an electronic component take station in which said electronic component supply device is located, and an electronic component mount station in which said substrate is located, said take and mount stations being provided at respective locations which are diametrically opposite to each other with respect to said axis of said table, the mounting heads of said head groups being supported by said table such that the number of the mounting heads of each of said head groups is even.

9. The apparatus as set forth in claim 8, further comprising an electronic component position error detect station provided at a location between said electronic component take and mount stations at which location none of the mounting heads of said head groups is stopped, said position error detect station comprising image pickup means for taking a projected image of an electronic component held by a mounting head which is being moved from said take station to said mount station and converting the projected image into binary coded signals, said image pickup means being disposed under a circular path along which said mounting head is moved as said table is rotated, said position error detect station further comprising error calculating means for comparing said binary coded signals with reference binary coded signals representative of a nominal position of said electronic component, and thereby calculating position errors, $\Delta X$ and $\Delta Y$, of a reference point on said electronic component held by said mounting head, and an angular error, $\Delta \theta$, of said electronic component about said reference point, said error calculating means being connected to said image pickup means.

10. The apparatus as set forth in claim 1, further comprising memory means for storing data relating to the equiangular distance predetermined with respect to said mounting heads of said each head group, and control means for controlling said drive means to intermittently rotate said table according to the data stored in said memory means.

11. The apparatus as set forth in claim 1, further comprising identifying means for identifying, each time said table is stopped, which one of said mounting heads is stopped at a reference place on a circular path along which said mounting heads are moved as said table is rotated by said drive means.

12. The apparatus as set forth in claim 11, wherein said identifying means comprises:

measuring means for measuring the rotation amount of said table, said measuring means resetting the measured rotation amount to zero each time each of the mounting heads of one of said head groups is stopped at said reference place, said one head group consisting of the smallest number of mounting heads;

memory means for storing data relating to a predetermined angular distance between said each of the mounting heads of said one head group having the smallest number of mounting heads and each of the mounting heads of the other head group or groups which are disposed between said each of the mounting heads of said one head group and a closest one of the mounting heads of said one head group, said closest one mounting head being adjacent to said each of the mounting heads of said one head group on the rear side of said each of the mounting heads of said one head group as viewed in a direction of rotation of said table; and comparing means for comparing the rotation amount of said table measured by said measuring means with the data sorted in said memory means each time said each of the mounting heads of said other head group or groups is stopped at said reference place, and thereby identifying which one of said mounting heads of said other head group or groups is stopped at said reference place.

13. The apparatus as set forth in claim 11, wherein said identifying means comprises:

measuring means for measuring a rotation amount of said table, said measuring means resetting the measured rotation amount to zero each time each of at least one of the mounting heads of one of said head groups is stopped at said reference place, said one head group consisting of the smallest number of mounting heads;

memory means for storing data relating to a predetermined angular distance between said each of at least one of the mounting heads of said one head group and each of the mounting heads of any head group which are disposed on the rear side of said each of at least one of the mounting heads of said one head group as viewed in a direction of rotation of said table; and comparable means for comparing the rotation amount of said table measured by said measuring means with the data stored in said memory means each time said each of the rearward disposed mounting heads is stopped at said reference place, and thereby identifying which one of said rearward disposed mounting heads is stopped at said reference place.

14. The apparatus as set forth in claim 1, further comprising:

an electronic component take station in which said electronic component supply device is located, and an electronic component mount station in which said substrate is located, said take and mount stations being provided at respective locations which are diametrically opposite to each other with respect to said axis of said table, the mounting heads of said head groups being supported by said table such that the number of the mounting heads of each of said head groups is even; and generating means for generating a head group change signal for changing a head group which currently is used for the electronic component taking and mounting operation, to another head group which subsequently is used for the same operation; and transition control means for controlling said drive means, upon generation of said head group change signal, to intermittently rotate said table such that the mounting heads of both said current head group and said subsequent head group are stopped at said electronic component take and mount stations, until the mounting heads of said current head group mount on said substrate all the electronic components that have been held thereby.

15. The apparatus as set forth in claim 14, wherein said transition control means comprises:

judging means for judging whether or not the head group change commanded by said head group change signal is such that the number of the mounting heads of said subsequent head group is smaller than the number of the mounting heads of said current head group; and transition stop control means for selecting one of two predetermined programs depending upon the affirmative or negative judgement of said judging means, and controlling said drive means according to the selected one program so that the mounting heads of both said current and subsequent head groups are stopped at said electronic component take and mount stations.

16. The apparatus as set forth in claim 15, wherein said transition stop control means comprises memory means for storing data relating to a predetermined angular distance between each of the mounting heads of said each head group and a closest one of the mounting heads of each of said other head group or groups on the rear side of said each mounting head of said each head group as viewed in a direction of rotation of said table, said transition stop control means controlling said drive means based on the data stored in said memory means.

* * * * *